(12) United States Patent
Aoyama et al.

(10) Patent No.: US 7,061,434 B2
(45) Date of Patent: Jun. 13, 2006

(54) SURFACE MOUNT TYPE CHIP ANTENNA AND COMMUNICATION EQUIPMENT MOUNTED THEREWITH

(75) Inventors: Hiroyuki Aoyama, Kumagaya (JP); Yasunori Takaki, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 134 days.

(21) Appl. No.: 10/804,107

(22) Filed: Mar. 19, 2004

(65) Prior Publication Data

US 2004/0183733 A1 Sep. 23, 2004

(30) Foreign Application Priority Data

Mar. 20, 2003 (JP) ............... 2003-079005

(51) Int. Cl.
*H01Q 1/24* (2006.01)
*H01Q 7/08* (2006.01)

(52) U.S. Cl. .................... 343/702; 343/788
(58) Field of Classification Search ............ 343/702, 343/700 MS, 895, 787, 788
See application file for complete search history.

(56) References Cited

U.S. PATENT DOCUMENTS

| | | | | |
|---|---|---|---|---|
| 6,058,315 A | * | 5/2000 | Clark | .............. 455/575.1 |
| 6,288,680 B1 | * | 9/2001 | Tsuru et al. | .............. 343/702 |
| 6,486,853 B1 | * | 11/2002 | Yoshinomoto et al. | ..... 343/895 |
| 6,580,397 B1 | * | 6/2003 | Lindell | .............. 343/702 |
| 6,683,572 B1 | * | 1/2004 | Abe et al. | .......... 343/700 MS |
| 2002/0075186 A1 | * | 6/2002 | Hamada et al. | ...... 343/700 MS |
| 2003/0190896 A1 | * | 10/2003 | Ota et al. | ................. 455/90.3 |

FOREIGN PATENT DOCUMENTS

| | | |
|---|---|---|
| EP | 1 460 715 A1 | 9/2004 |
| JP | 11-205025 | 7/1999 |
| JP | 2002-016419 | 1/2002 |

* cited by examiner

*Primary Examiner*—Hoang V. Nguyen
(74) *Attorney, Agent, or Firm*—Antonelli, Terry, Stout and Kraus, LLP.

(57) ABSTRACT

According to the present invention, a surface mount type chip antenna comprises a base made of a dielectric, magnetic substance or mixture thereof, at least one terminal portion provided on the mounted face of the base, a concave provided in the mounted face of the base except in the terminal portion, and at least one conductive wire wound around the base. Another feature is a surface mount type antenna device comprising a surface mount type chip antenna arranged in the vicinity of metallic functional components, and filter circuits connected to the power source side terminal of the metallic functional components.

13 Claims, 22 Drawing Sheets

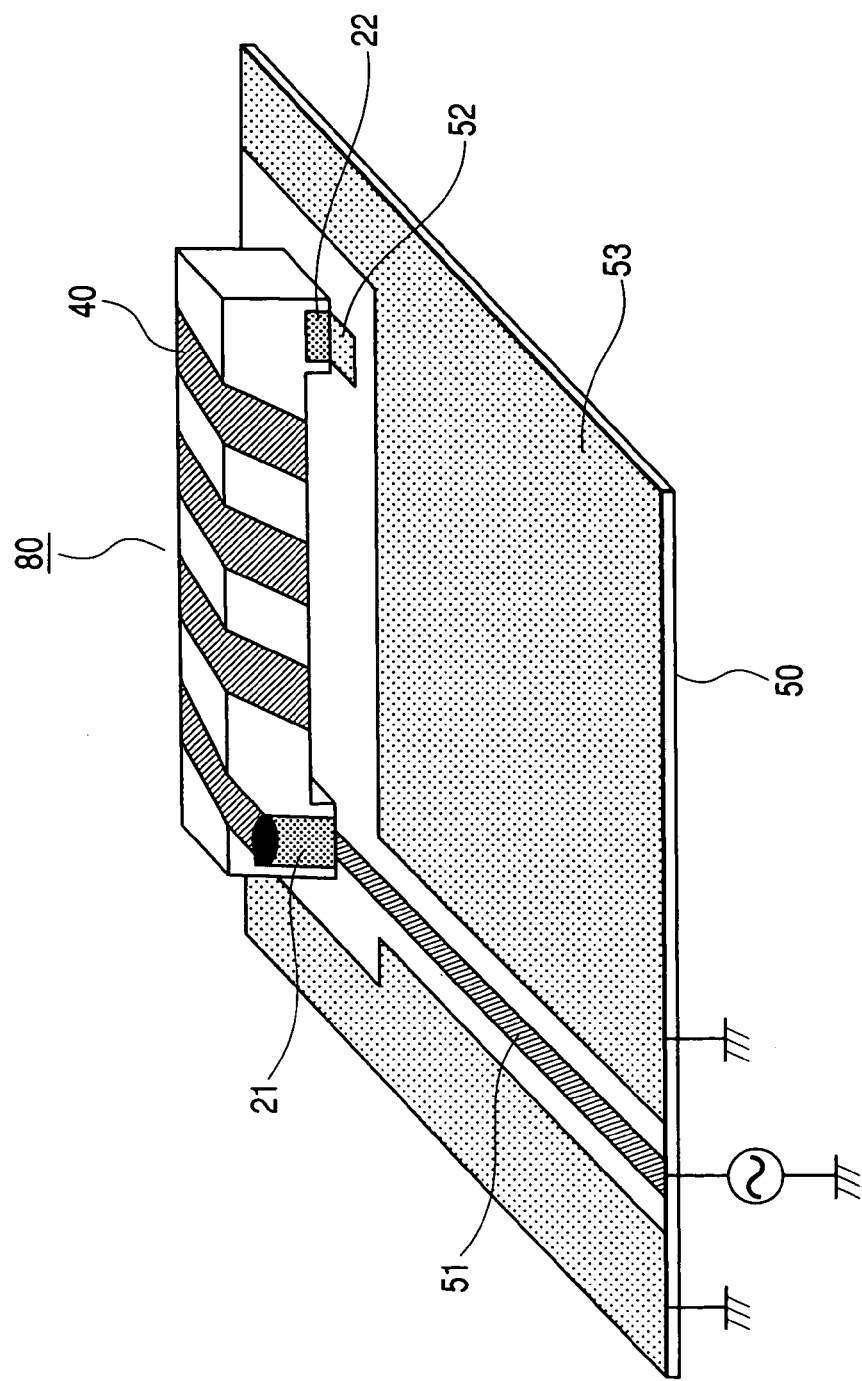

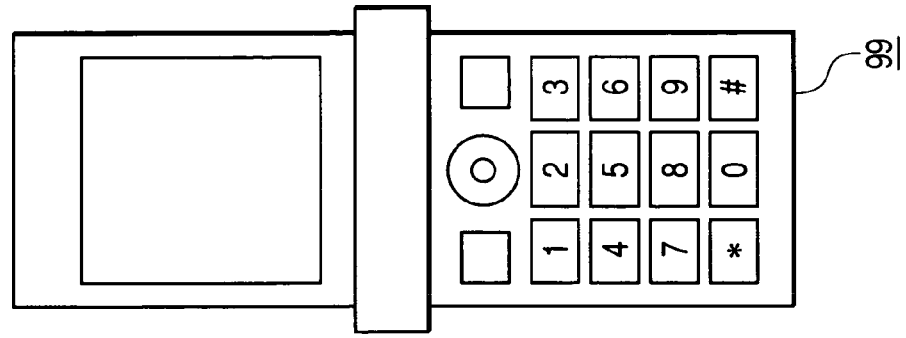
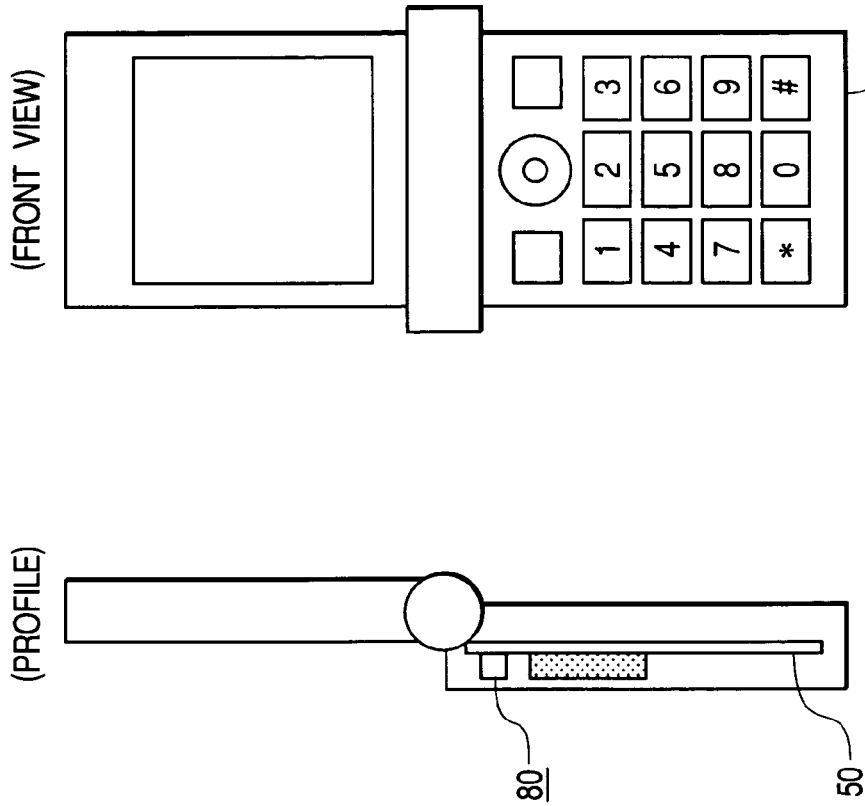
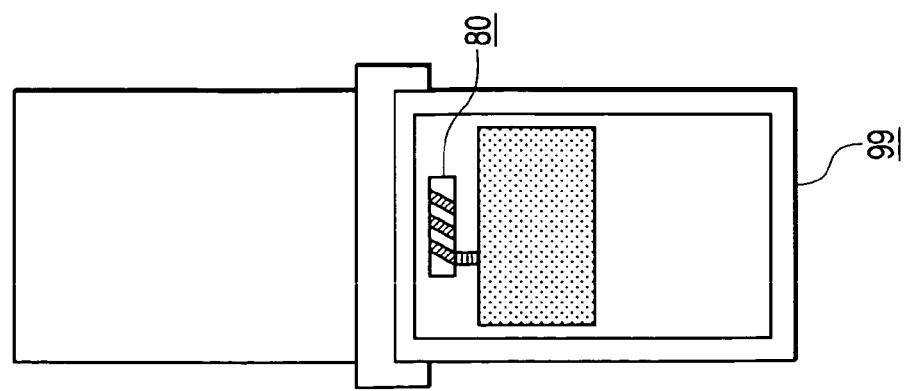

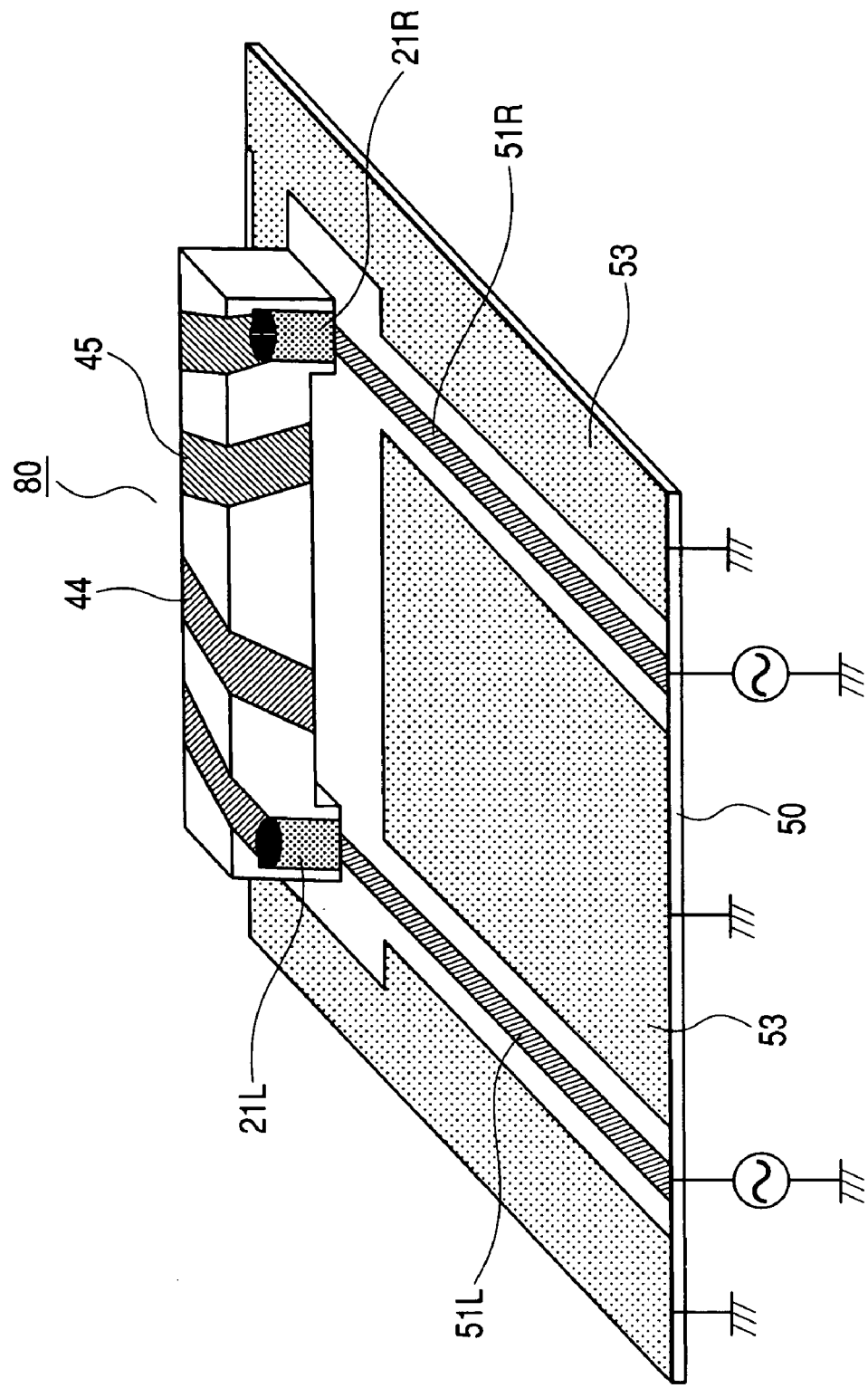

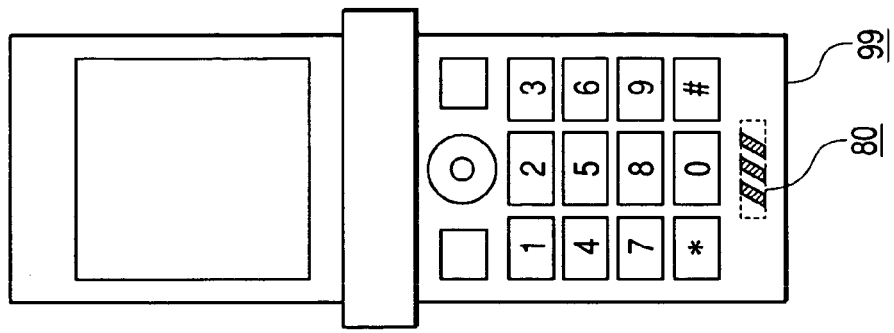
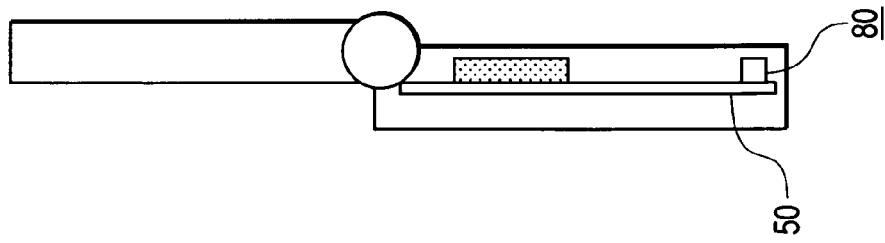
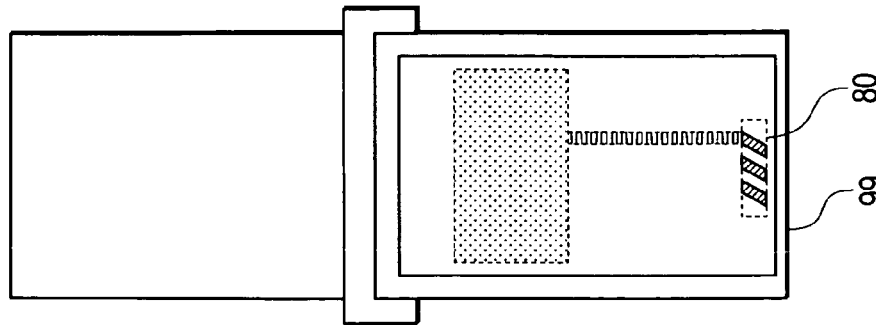

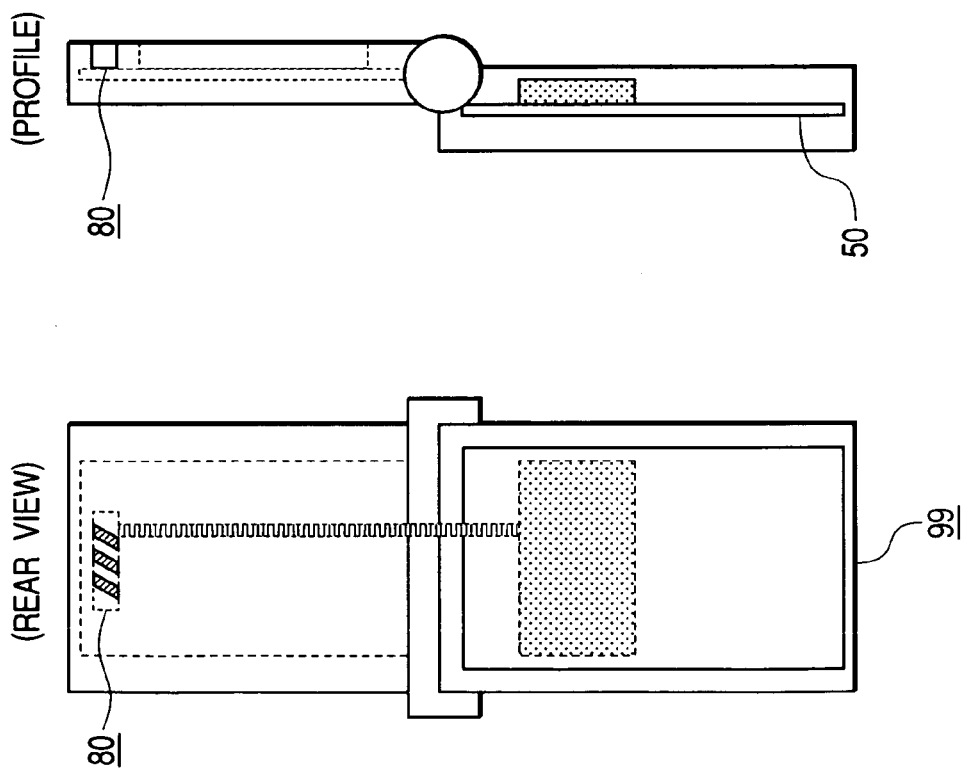
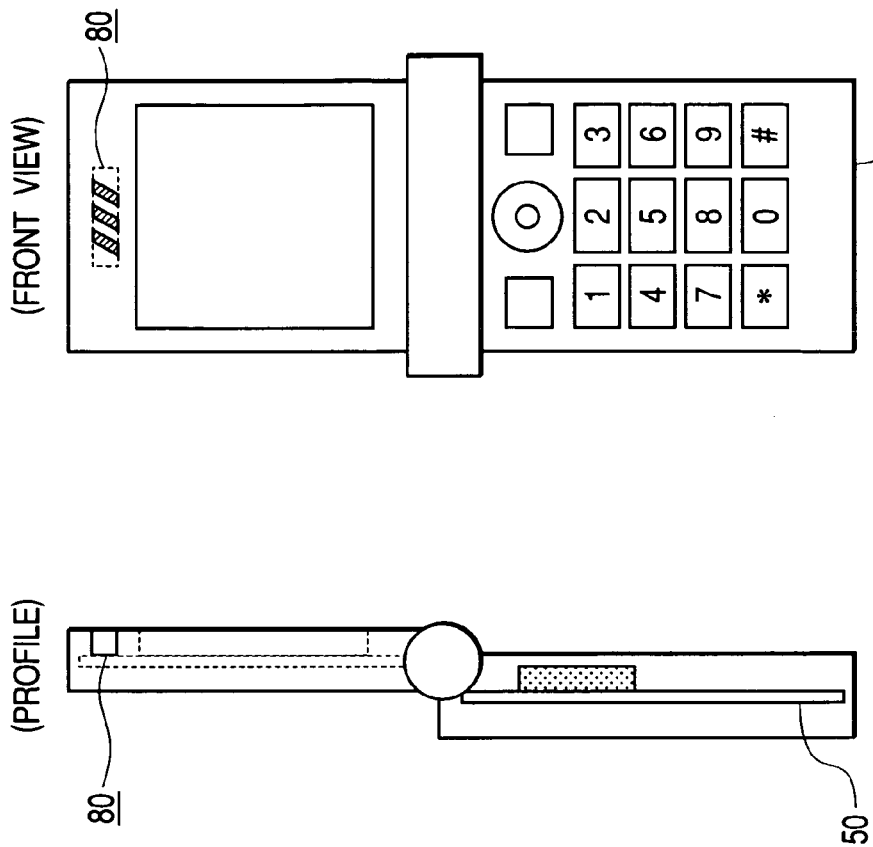
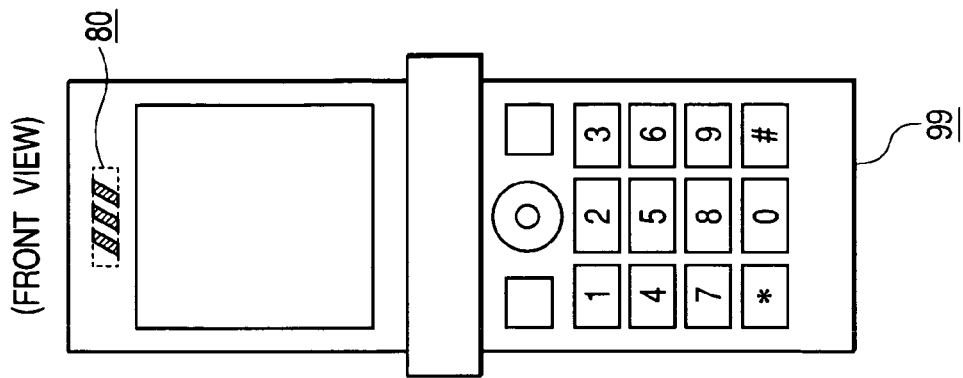
FIG. 17A (REAR VIEW)
FIG. 17B (PROFILE)
FIG. 17C (FRONT VIEW)

SURFACE MOUNT TYPE CHIP ANTENNA AND COMMUNICATION EQUIPMENT MOUNTED THEREWITH

FIELD OF THE INVENTION

The present invention relates to a chip antenna for use in communication equipment, such as a cellular phone or a mobile terminal device, and more particularly to a surface mount type chip antenna in which a conductive wire is wound on the surface of a base, and communication equipment mounted therewith.

BACKGROUND OF THE INVENTION

An example of conventional surface mount type chip antenna using a conductive wire is shown in FIG. 20 (see the Japanese Patent Laid-Open No. H11(1999)-205025). This drawing shows a perspective view of a chip antenna 90, which is provided with a conductive wire 92 spirally wound inside a base 91 in its lengthwise direction, a power feed terminal 93 which is formed over the surface of the base 91 and to which one end of the conductive wire 92 is connected, and a grounding terminal or terminals 94 formed at least either within or over the surface of the base 91. Reference sign 95 denotes an open end, and 96, a ground pattern. As this chip antenna 90 has its conductive wire 92 formed inside the base 91, its manufacturing process is complex. Because of this formation of the conductive wire 92 inside the base 91, it is also impossible, after the manufacture, to vary the length of the conductive wire to adjust the resonance frequency or to match the input impedance to, for instance, 50 ohms. Furthermore, even if the conductive wire is spirally wound around the other surface of the base, when this chip antenna is to be mounted on a substrate, the presence of the conductive wire outside would make it correspondingly difficult to settle it on the substrate, which means a problem in mounting stability. Even after its mounting, if a bending force works on the substrate, a stress will arise in the chip antenna terminal portion and, moreover, the antenna will be affected by a distortion due to the difference in thermal expansion coefficient from the substrate.

One of the attempts to eliminate this manufacturing complexity and the poor mounting stability is, for example, a chip antenna disclosed in the Japanese Patent Laid-Open No. 2002-16419. In this surface mount type chip antenna, a level-gapped portion 120 is provided around the full circumference of a base 110 as shown in FIG. 21, a spiral conductive wire 130 is wound around this level-gapped portion 120, and the two ends of this conductive wire 130 are connected via conductive caps 140 and 150, each covering the whole circumferential face of terminal portions at both ends of the base 110.

These surface mount type antennas find a wide variety of applications including not only main antennas for cellular phones and the like but also chip antennas for wireless LANs and the Global Positioning System (GPS), and each has to be mounted in a narrowly limited space in the cellular phone or the like. As the frequency band of the electric wave used in telephone communication via the surface mount type antenna (800 to 900 MHz) and that of the GPS electric wave (1700 to 1900 MHz) differ from each other, both the antenna for telephone communication and that for-receiving GPS information have to be accommodated in the already tight space.

In addition, the substrate over which the surface mount type antenna is arranged is often mounted with devices emitting an electromagnetic wave, such as a loudspeaker, a vibrator and more recently a small CCD camera, accommodated in a metallic case. The limitation of the space frequently obliges the antenna to be arranged close to the loudspeaker and/or the vibrator, and this arrangement might invite mutual interference between the metallic functional components, such as the loudspeaker, vibrator and small CCD camera, and the antenna.

A communication device such as a cellular phone is always required to be not only small and suppressed in height but also adaptable to a wide bandwidth and highly efficient. The surface mount type chip antenna illustrated in FIG. 21, though improved in mounting ease, embodies no consideration for the performance requirements of the antenna, such as a broad bandwidth and a high radiation gain. For instance, as shown in FIG. 21, the level-gapped portion 120 is disposed around the whole circumferential face of a prismatic base, and the terminal portions 140 and 150 are also provided all around the circumferential face. While these arrangements are intended to eliminate the directionality of the power feed electrode and increase the ease of mounting, they also involve a problem that the terminal portions thicker than the level-gapped portion, which constitutes a greater part of the side faces of the base, limit the thickness of the base. In order to obtain an antenna having a broad bandwidth and a high radiation gain, it is necessary to reduce the Q-value, which is in reverse proportion to these characteristics. To be more specific, this is achieved by using a material of a low relative dielectric constant or increasing the thickness of the base. On the other hand, the higher the relative dielectric constant of the base, the shorter the radiation electrode. On account of these factors, if the bandwidth and the radiation gain are to be increased while keeping the relative dielectric constant of the base unchanged, the thickness of the base will have to be increased. Therefore, in the case illustrated in FIG. 21, even if required characteristics are satisfied, the additional arrangement of the level-gapped portion over it will entail a problem that the base is further thickened. Moreover, as the sectional area of the base is reduced correspondingly to the presence of the level-gapped portion, it is necessary to increase the length of the base in order to secure a sufficient winding length of the conductive wire. Furthermore, in the manufacturing aspect too, the conventional configurations require a groove to guide the conductive wire or terminal caps, which adds to the manufacturing complexity and cost.

Also, because of the aforementioned requirement for reductions in size and height, the chip antenna and metallic functional components, such as a loudspeaker and a vibrator, are often arranged close to each other over the circuit substrate. In such a case, it is desirable to prevent mutual interference.

SUMMARY OF THE INVENTION

In view of these problems, an object of the present invention is to provide a surface mount type chip antenna permitting ready impedance adjustment, excelling in mounting stability, expanded in bandwidth and improved in radiation efficiency.

Another object of the present invention is to provide an antenna device in which mutual interference between a chip antenna and metallic functional components, such as a loudspeaker and a vibrator, is prevented and communication equipment using these chip antenna and antenna device.

A surface mount type chip antenna according to the present invention comprises a base made of a dielectric, magnetic substance or mixture thereof, at least one terminal portion provided on the mounted face of the base, a concave provided in the mounted face of the base except in the terminal portion, and at least one conductive wire wound around the base.

According to the invention, as the presence of the concave serves to reduce the area of contact between the chip antenna and the substrate to be mounted therewith, advantages of satisfactory mounting stability and reducing the distortion due to the difference in thermal expansion coefficient from the substrate after the mounting are provided. The mounting stability here means the ease of mounting when the chip antenna is fixed to the substrate by soldering. The high mounting stability ensures a restrained level of insecurity of fixation to the substrate. Therefore, the ease of automatic assembling is improved. Regarding the antenna characteristic, a reduction in the inter-line capacity Cws between the winds of the conductive wire contributes to expanding the bandwidth. The reason will be explained afterwards with reference to FIG. 4. Further, if the relative dielectric constant is the same, the thickness of the base can be reduced, resulting in enhanced radiation efficiency and gain due to the concentration of the energy of the electromagnetic wave.

Preferably in the surface mount type chip antenna according to the invention, the conductive wire should be a flat and rectangular conductive wire. This serves to reduce the impact of the skin effect, and this, together with the low D.C. resistance, provides the benefit of reduced losses. The reason will be explained afterwards with reference to FIG. 6.

In the surface mount type antenna device according to the invention, preferably the base of the chip antenna should be 5 mm or less in thickness and 30 mm or less in length, the depth of the concave, 4 mm or less, and the flat and rectangular conductive wire, 2 mm or less in width and 0.01 to 0.2 mm in thickness.

Further in the surface mount type chip antenna, a plurality of the conductive wires and at least two of the terminal portions can be provided to be responsive to a plurality of frequency bands. This enables the antenna to be responsive to a plurality of, i.e. two or more, frequencies without requiring a filter.

Another characteristic of the invention is realized in a surface mount type antenna device comprising a surface mount type chip antenna arranged in the vicinity of, more specifically at a distance of no more than ¼ of the wavelength of the electromagnetic wave radiated from the chip antenna from, metallic functional components such as a loudspeaker, vibrator, small CCD camera and the like, and filter circuits connected to the power source side terminal of the metallic functional components. Incidentally in the context of the present invention, the term "antenna device" covers the chip antenna, the metallic functional components and the like.

The invention can eliminate the constraint on the position of arrangement, and prevent, with a filter, mutual interference between, for instance, a GPS information reception antenna and a loudspeaker, vibrator and the like without obstructing the function of the antenna for telephone communication.

The invention also provides communication equipment mounted with any of the surface mount type chip antennas or surface mount type antenna devices described above.

The invention further provides the benefit of manufacturing ease and high sensitivity in the transmission and reception of signals.

BRIEF DESCRIPTION OF THE DRAWINGS

FIG. 1A shows an external perspective view; FIG. 1B, a perspective view revealing the conductive wire inside; and FIG. 1C, another perspective view of the antenna from the reverse side.

FIG. 2A shows the surface mount type chip antenna according to the invention; and FIG. 2B, a front view of a surface mount type chip antenna, which is a comparative example, both mounted on a substrate.

FIG. 3B shows dimensions of the antenna. FIG. 3C shows the Q-value with respect to T/H of the antenna. FIG. 3D shows the bandwidth BW of the antenna.

FIG. 4A shows a flat rectangular wire used in the invention; and FIG. 4B, a round wire used in the comparative example.

FIGS. 5A, 5B, and 5C illustrate thee surface mount type chip antenna according to the invention mounted on a substrate: FIG. 5A shows a perspective view; FIG. 5B, a plan of the mounted face of the substrate; and FIG. 5C, a plan viewed from the reverse side to the mounted side.

FIGS. 8A, 8B, and 8C show an example of communication equipment mounted with the surface mount type chip antenna according to the invention.

FIG. 12A shows a perspective view; FIG. 12B, a plan of the mounted face of the substrate; and FIG. 12C, a plan viewed from the reverse side to the mounted side.

FIGS. 13A, 13B, and 13C illustrate a surface mount type chip antenna, which is still another preferred embodiment of the invention: FIG. 13A shows a front perspective view; FIG. 13B, a perspective view from the reverse side; and FIG. 13C, the antenna mounted on a substrate.

FIG. 14A shows a front perspective view; and FIG. 14B, a perspective view from the reverse side.

FIG. 15A shows a case in which the antenna has one antenna element; and FIG. 15B, a case in which it has two antenna elements.

FIGS. 16A, 16B, and 16C show another example of communication equipment mounted with a surface mount type chip antenna according to the invention.

FIGS. 17A, 17B, and 17C show still another example of communication equipment mounted with a surface mount type chip antenna according to the invention.

DETAILED DESCRIPTION OF THE PREFERRED EMBODIMENTS

[Basic Configuration of Chip Antenna]

Figure 1A:
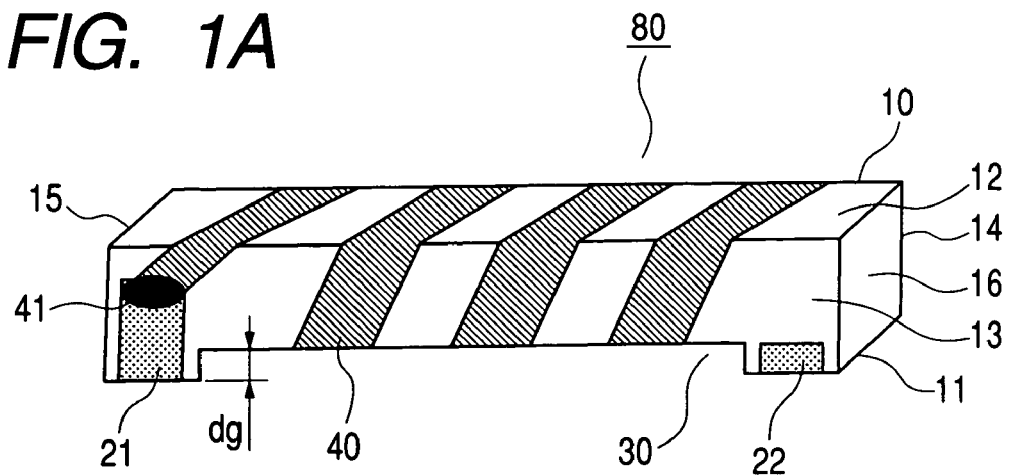
FIGS. 1A, 1B, and 1C illustrate a surface mount type chip antenna, which is a preferred embodiment of the present invention.
Figure 1B:
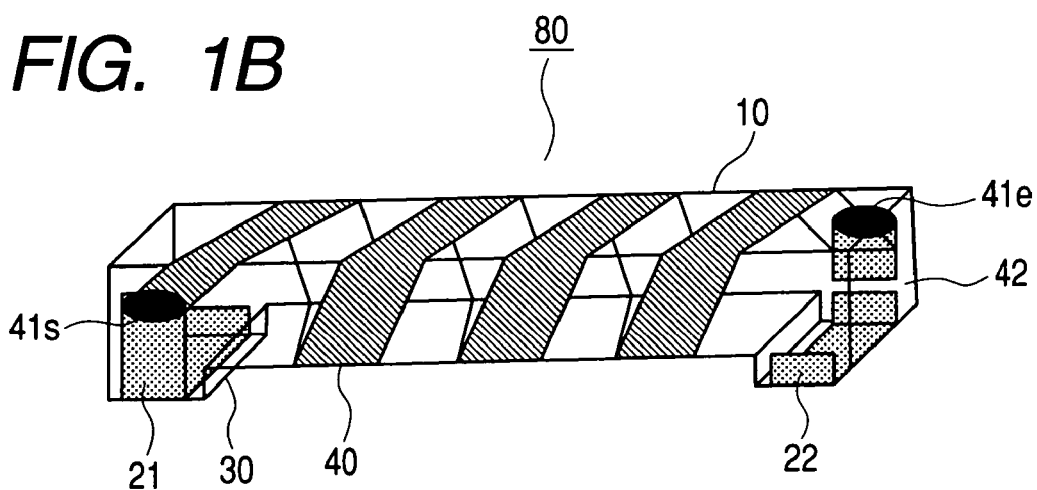
Figure 1C:
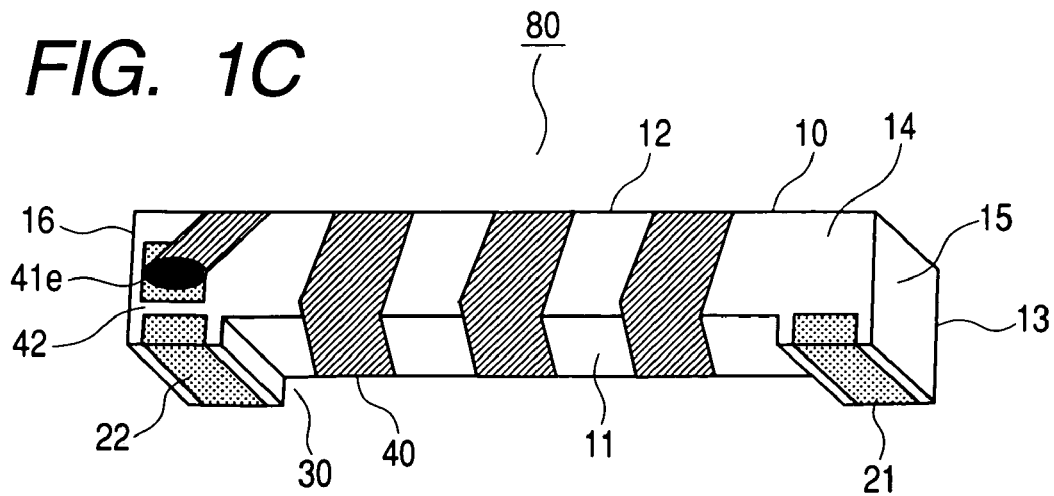

Referring to FIGS. 1A, 1B, and 1C, a surface mount type chip antenna 80 (hereinafter referred to simply as the antenna) is composed of a base 10 consisting of a dielectric, a power feed terminal 21 provided at one end of the mounted face (the rear face) 11 of the base 10, a substrate fixing terminal 22 provided at the other end of the mounted face 11 of the base 10, a concave 30 provided in the rear face 11, which constitutes the mounted face of the base, except a portion where the power feed terminal 21 and the fixing terminal 22 are arranged, and a conductive wire 40 spirally wound around the base 10.

No concave is provided in the other main face 12, opposite to the mounted face 11. This is intended to reduce the Q-value of the antenna and thereby to broaden the bandwidth by effectively utilizing the sectional area of the winding reel of the base 10 and maximizing the self-inductance of the winding within the limited size. Since the resonance frequency of the antenna drops with an increase in self-inductance, it is made possible to reduce the size of the chip antenna with the resonance frequency being unchanged.

The power feed terminal 21 and the conductive wire 40 can be electrically connected to each other by soldering, brazing, caulking, welding, crimping or otherwise. The power feed terminal 21 and the fixing terminal 22 are formed in advance of electrodes of Ag, Ag—Pd, Cu or the like, and they can be formed by printing with electroconductive paste, plating, solder plating or otherwise.

FIG. 1B is a schematic diagram revealing the inside of the base 10 to facilitate visual perception of the connection among the power feed terminal 21, the fixing terminal 22 and the conductive wire 40. The conductive wire 40 is not connected to the fixing terminal 22, and is electrically insulated by an open portion 42. Therefore, though one end of the conductive wire 40 is connected to the power feed terminal 21 at an connecting portion 41s, the other end 41e of the conductive wire 40 is an open end, which transmits and receives electromagnetic waves.

FIG. 1C shows a perspective view of the chip antenna 80, shown in FIG. 1A, from the reverse side. Thus it shows an open end side profile 14. The other end 41e of the conductive wire 40 is revealed to constitute the open end 42 via an open portion 43.

[Configuration of Base Concave]

Figure 2A:
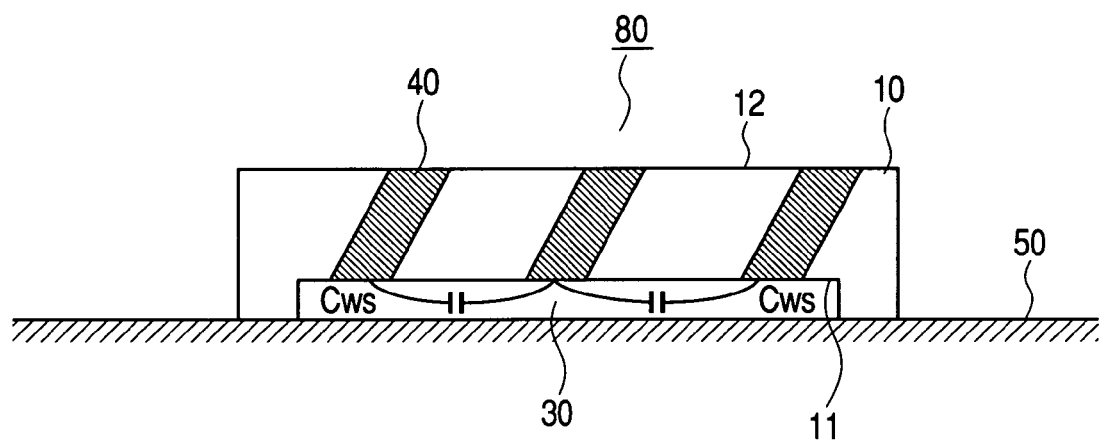
FIGS. 2A and 2B illustrate the operational effects of the invention.
Figure 2B:
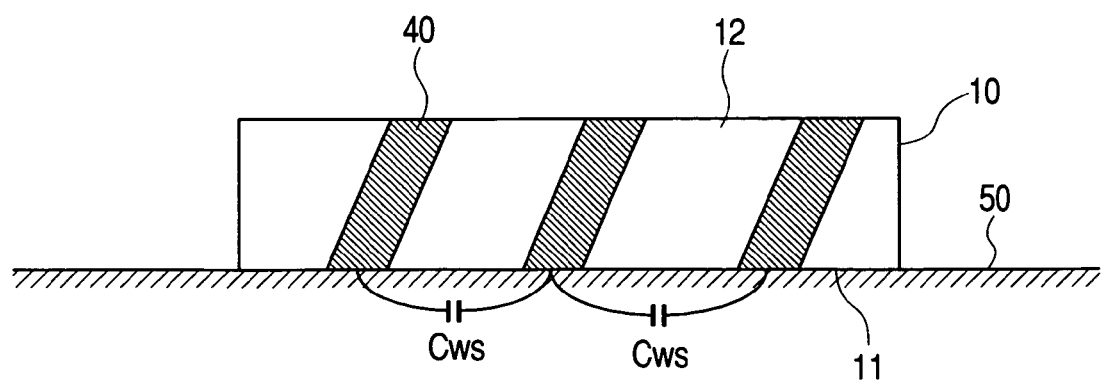

FIGS. 2A and 2B illustrate the effects of the concave 30 in the chip antenna 80 according to the invention: FIG. 2A shows a case in which the concave 3b is provided in the configuration of the invention, and FIG. 2B, it is not.

Referring to FIG. 2A, the inter-line capacity Cws between the winds of the conductive wire 40 on the rear face 11 which constitutes the mounted face opposite to a substrate 50 is formed via air whose dielectric constant is 1. Referring to FIG. 2B on the other hand, the inter-line capacity Cws between the winds of the conductive wire 40 is formed via the reverse face 11, constituting the mounted face, whose relative dielectric constant to the substrate is about 4 to 5, because the whole reverse face 11, which serves as the mounted face, is in contact with the substrate 50. Therefore, the inter-line capacity Cws between the winds of the conductive wire 40 in FIG. 2B is far greater than that in FIG. 2A, and this is undesirable.

Figure 3A:
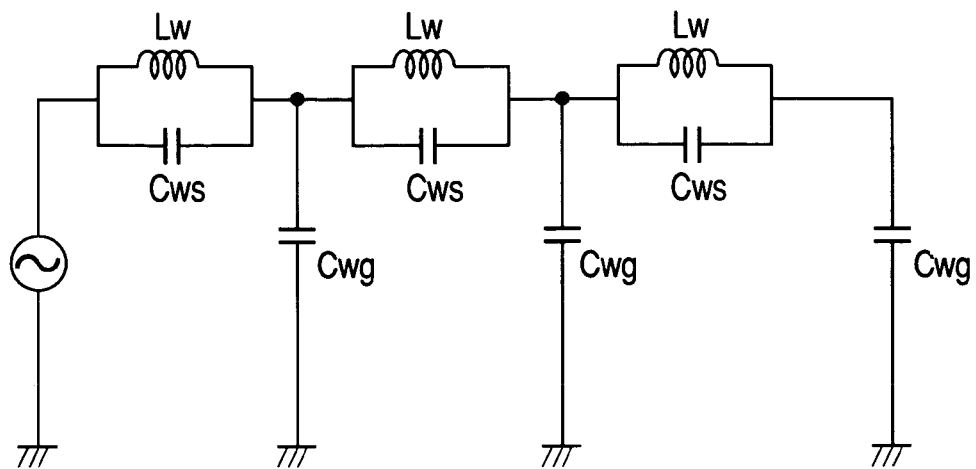
FIG. 3A shows an equivalent circuit to the surface mount type chip antenna according to the invention.

Next will be described, with reference to FIG. 3A, the relative span of the bandwidth of the antenna between FIGS. 2A and 2B cited above. Although in reality a resistance R of the conductive wire 40 and the like (not shown) is present, here is shown an ideal state of zero in the resistance R, wherein the inter-line capacity Cws between the winds of the conductive wire 40 is connected in parallel to the inductance Lw of the conductive wire 40.

Since the inter-line capacity Cws between the winds of the conductive wire 40 in FIG. 2B is greater than that in FIG. 2A at least by the multiple of the dielectric constant, the Q-value which represents the acuteness of the antenna increases, and the bandwidth to which the reciprocal of the Q-value relates becomes narrower. By contrast, the chip antenna 80 according to the invention shown in FIG. 2A is small in Q-value and large in bandwidth. To explain this aspect in some more detail, in the antenna equivalent circuit shown in FIG. 3A, Cws>>Cwg holds, where Cws is the electrostatic capacity between winds and Cwg is the electrostatic capacity between the windings and grounding provided on the substrate, because the relative dielectric constant of the base is greater than the relative dielectric constant of vacuum (=1). Therefore, from the relationship of $Q \propto \sqrt{(Cws/Lws)}$ and a bandwidth $BW \propto 1/Q$ is derived approximately $BW \propto \sqrt{(Lws/Cws)}$. Thus, the greater the value of L and the smaller the value of C, the greater the bandwidth BW. As a result, even if the resonance frequency is varied by the frequency fluctuation of the chip antenna or the approach of a human body (face, hand or the like) around a terminal, highly stable and reliable wireless communication can be realized. As the only dielectric around the winding of the antenna of FIG. 2A is the base and its Cws level is lower than that of FIG. 2B, a broader bandwidth can be achieved. For an even broader bandwidth, it is desirable to configure the base of a magnetic substance or a mixture of a dielectric and a magnetic substance and thereby increase the self-inductance LWs.

Also, because a broader bandwidth can be achieved, in the chip antenna according to the invention two conductors can be formed to make possible a dual band configuration which enables a single chip antenna to serve two frequencies. More specifically, two power feed terminals for the antenna are provided in different positions on the base, and the conductors are spirally wound from these terminals around the base. The two terminals can be positioned either at the two ends or near the center of the base, and the structure is such that the two windings do not come into contact with each other. This configuration provides the advantage of eliminating switches or filters for changing over the antenna. This point will be described in more specific terms with reference to a preferred embodiment of the invention.

Figure 21:
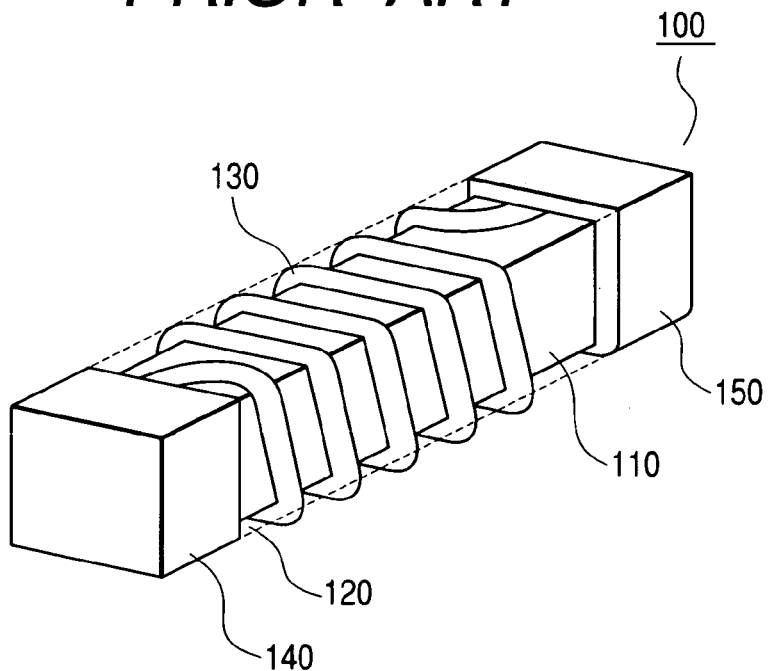
FIG. 21 shows a perspective view of another example of conventional surface mount type chip antenna.

Moreover, according to the present invention, the arrangement of the concave 30 only on the mounted face side prevents the thickness of the terminal portions at the two ends of the base from determining the thickness of the base itself as is witnessed in the conventional configuration shown in FIG. 21. With a base of the same relative dielectric constant, the base thickness can be reduced correspondingly to the absence of the level-gapped portion over its upper face. Further, the presence of the concave 30 in the mounted face serves to reduce the area of contact between the chip antenna 80 and the substrate 50 to be mounted with it. Accordingly, greater stability can be ensured in mounting and, after the mounting too, the impact of distortion due to a difference in thermal expansion coefficient from the substrate can be reduced.

In the preferred embodiment shown in FIGS. 1A, 1B, and 1C, the concave 30 is formed with a level gap except at both ends of the base 10. The concave 30 is formed except in the positions of the power feed terminal 21 and the fixing terminal 22 provided at the two ends of the base 10. The expression here "except in the positions of the power feed terminal 21 and the fixing terminal 22" does not mean all other parts than the power feed terminal 21 and the fixing terminal 22 but except the power feed terminal 21 and the fixing terminal 22 plus other parts necessary for their formation and for ensuring their sufficient strength. As schematically shown in FIGS. 1A, 1B, and 1C, a level gap is formed slightly inward from each of the power feed terminal 21 and the fixing terminal 22. This level gap need not be a right-angled step, but may be inclined or have any other desired appropriate shape.

Now, while the concave 30 may be formed in a finished base 10 by such means of machining as cutting and grinding, it can as well be integrally formed into the base 10 by pressure-shaping of powder with a metallic mold. By providing the metallic mold in advance with a convex portion matching the concave 30, the concave 30 can be formed by plastic working when powder of the dielectric is sintered under pressure. This process is superior in material yield and more productive. It is preferable for the depth dg of the concave 30 to be 0.01 mm or more and not more than about ½ of the thickness of the base 10. If it is less than 0.01 mm, the concave will have no effect to stabilize mounting or to increase the bandwidth, and if it is more than about ½ of the thickness of the base 10, the sectional area of the base 10 will decrease to reduce the sectional area of the reel of the conductive wire 40, which might invite a drop in antenna gain.

Figure 3B:
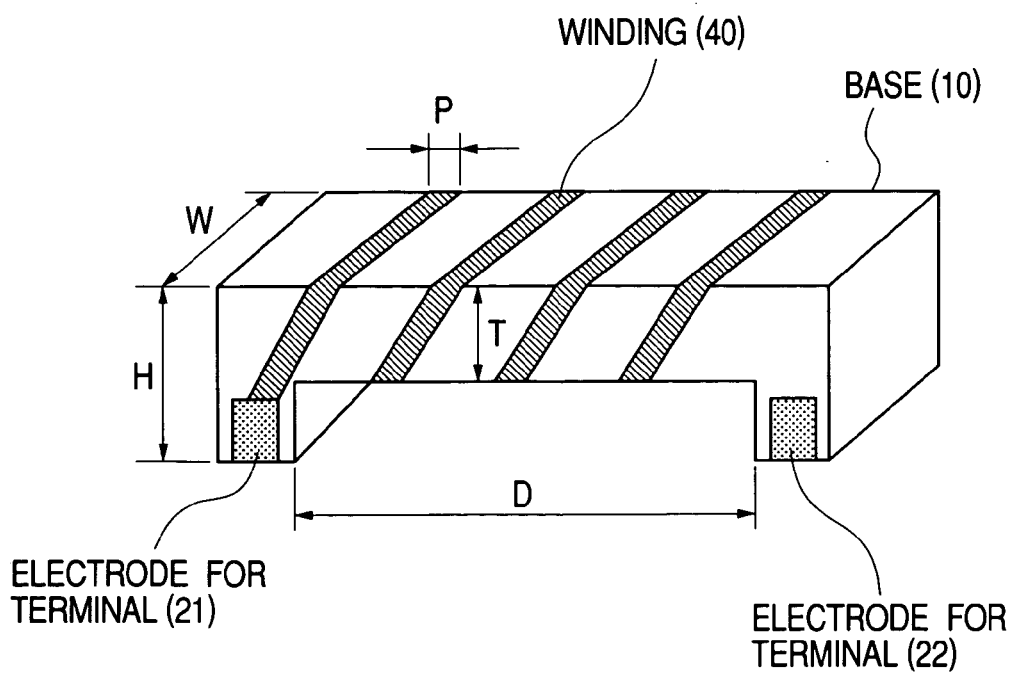
FIGS. 3B, 3C and 3D illustrate the relation between the depth of the concave of said antenna and effects.

The depth of this concave will be explained with reference to drawings. Referring to FIG. 3B, L in L(H), which represents the self-inductance of the antenna, can be expressed in the following equation:

$$L = n^2 \times T \times W \times \mu \quad (1)$$

where n is the number of turns of the winding, and $\mu$, the permeability ($= \mu_c \times \mu_0$), $\mu_c$ being the specific permeability of the base and $\mu_0$ being the permeability of vacuum ($=1.257 \times 10^{-6}$ H/m)

The static capacity C[F] attributable to the antenna winding can be expressed in the following equation:

$$C = \frac{n^2}{D} \times (T + W) \times 2 \times P \times \varepsilon \quad (2)$$

where $\varepsilon$ is the effective dielectric constant of the base:

$$\varepsilon = \sqrt{\left(\varepsilon c \times \frac{T}{H}\right)^2 + \left(1 - \frac{T}{H}\right)^2} \times \varepsilon_0 \quad (3)$$

$\varepsilon c$ being the relative dielectric constant of the base and $\varepsilon_0$ being the dielectric constant of vacuum ($=8.855 \times 10^{-12}$ F/m).

With the resonance frequency of the antenna being represented by $f_0$[Hz]:

$$f_0 = \frac{2\pi}{\sqrt{LC}} \quad (4)$$

$$Q = \sqrt{\frac{C}{L}} \quad (5)$$

Substitution of Equations (1) and (2) into (5) gives:

$$Q = \sqrt{\frac{2 \times P}{D} \times \left(\frac{1}{W} + \frac{1}{T}\right) \times \frac{\varepsilon}{\mu}} \quad (6)$$

Figure 3C:
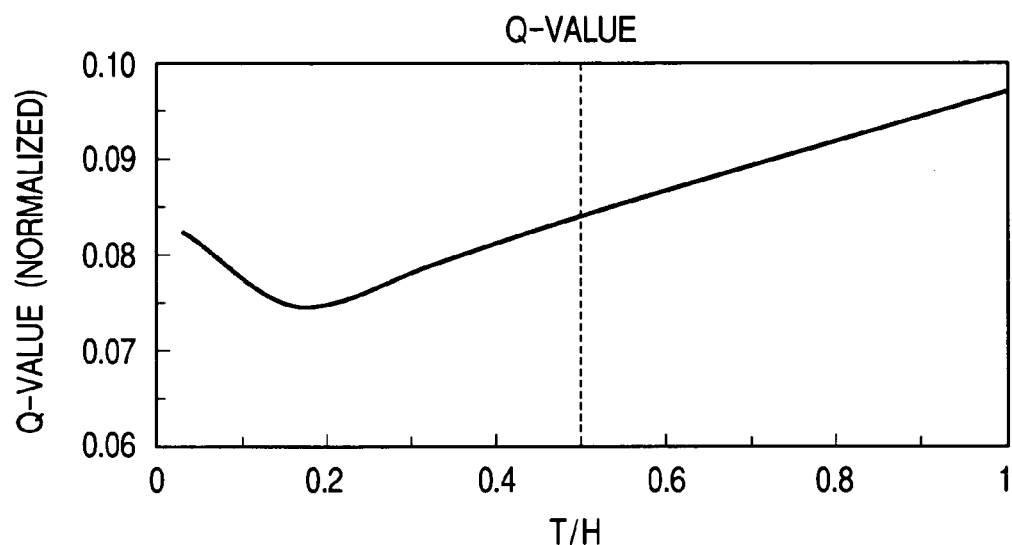

Figuring out the Q-value with respect to T/H will give the result of FIG. 3C, where D=30 [mm], P=1 [mm], W=3 [mm], $\varepsilon_c$=30 and $\mu_c$=1. The bandwidth BW of the antenna can be obtained by the following equation:

$$BW = \frac{1}{Q} \times \frac{f_0}{100} \quad (7)$$

Figure 3D:
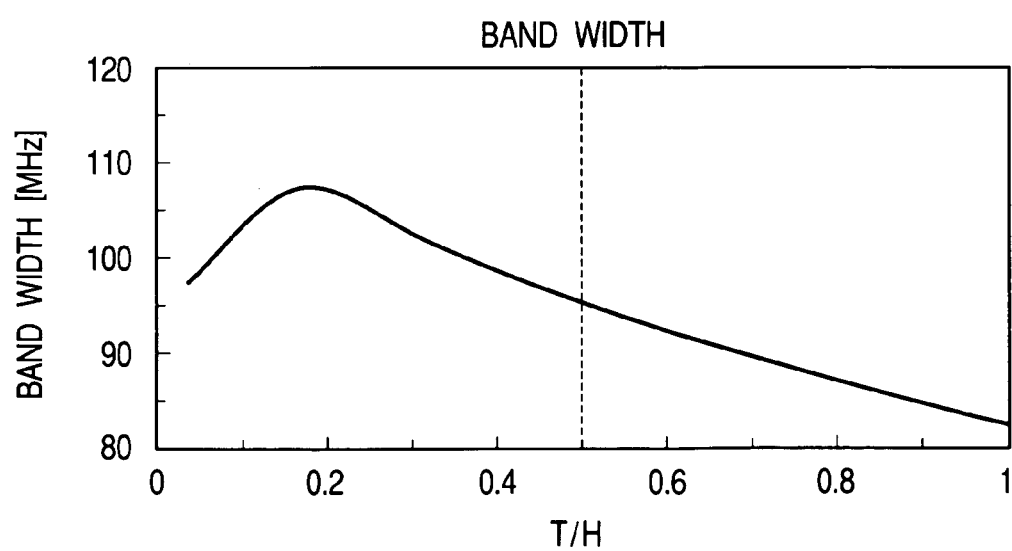

The result is given in FIG. 3D where $f_0$=800 [MHz].

These results endorse the preferability of the range of T/H which is not more than about ½ of the base thickness.

Next will be discussed the preferable range of the dimensions of the base 10. The preferable length is 10 to 30 mm. A length of less than 10 mm would make winding of the conductive wire 40 difficult, while a length of more than 30 mm would be too great and accordingly not preferable for a surface mount type chip antenna. The preferable width is 2 to 10 mm. A width of less than 2 mm would make winding of the conductive wire 40 difficult, while a width of more than 10 mm would be too great and accordingly not preferable for a surface mount type chip antenna. The preferable thickness is 1 to 5 mm. A thickness of less than 1 mm would make winding of the conductive wire 40 difficult, while a thickness of more than 5 mm would be too great and accordingly not preferable for a surface mount type chip antenna.

[Configuration of Conductive Wire]

In the present invention, the sectional shape of the conductive wire 40 can be either round or flat and rectangular, and its form can be selected from a wide variety including plate and foil, but a flat and rectangular plate-shaped wire is preferable.

Figures 4A, 4B:
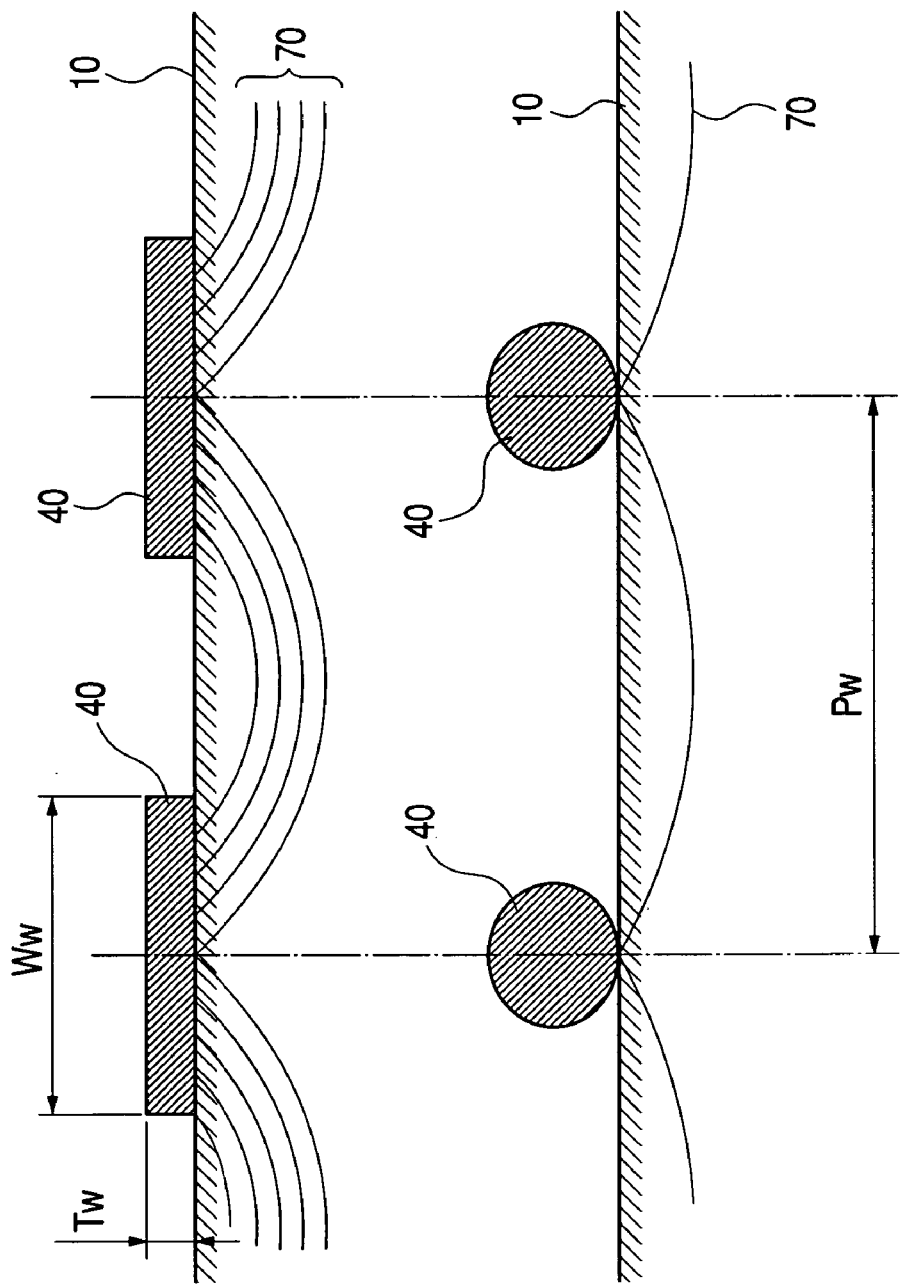
FIGS. 4A and 4B schematically show a section of the conductive wire.

The reason for this choice will be described below with reference to FIGS. 4A and 4B. The flat and rectangular conductive wire pertaining to the invention has a relationship of Ww>Tw as shown in FIGS. 4A and 4B. Here, Ww represents the width of the conductive wire 40 and Tw, the thickness of the conductive wire 40. FIG. 4A shows a case in which a flat and rectangular conductive wire is used as the conductive wire 40 and FIG. 4B, a case in which a round wire is used. As shown in FIG. 4A, as a flat and rectangular conductive wire is in face contact with the base 10, electric lines of force EL are uniformly distributed within the base 10. On the other hand, as a round wire is in point contact with the base 10 as shown in FIG. 4B, electric lines of force EL concentrate. Therefore, use of a round wire would invite greater losses because high frequency currents would flow concentrating in the vicinities of the point of contact. By contrast, use of a flat and rectangular conductive wire would result in an improved antenna gain, because the resultant even flow of currents all over would serve to reduce losses.

Furthermore, since a round wire would be only in point contact, a groove or some other fixing means of preventing the wire from displacement or deviation would be needed, but no such fixing means would be necessarily needed where a flat and rectangular conductive wire is used.

The constituent material of the conductive wire 40 can be selected from such conductors as copper, silver, gold, aluminum, nickel and alloys thereof. An element or elements prescribed for improving the weatherproofness and other desirable properties could be added to one of such materials as copper, silver, gold, aluminum and nickel. An alloy of a conductor and a nonmetallic substance may be used as well. Frequently used constituent materials include copper and its alloys by virtue of their lower cost, resistance to corrosion and machining ease.

Where copper or one of its alloys is to be used for the conductive wire 40, the thickness Tw of the conductive wire 40 should preferably be 0.01 to 0.2 mm. If the thickness Tw of the conductive wire 40 is less than 0.01 mm, the conductor resistance will increase to invite losses. If the thickness Tw of the conductive wire 40 is more than 0.2 mm, the bending strength will become too great, and may adversely affect the working ease of the conductive wire or damage the base 10. Where the conductive wire 40 is to be made of aluminum, gold or the like, this thickness range may be reviewed as appropriate. On the other hand, the thickness Tw of the conductive wire 40 can be selected as appropriate from a range from a few times as great as this thickness Tw to about 2 mm.

Further, in order to reduce the inter-line capacity CwS of the conductive wire 40, the pitch Pw of the winds of the flat and rectangular conductive wire 40 should be relatively wide. Also, decreasing the thickness Tw of the conductive wire 40 would help reduce the inter-line capacity CwS of the conductive wire 40. This is because the areas of the opposite sides of the flat and rectangular wire would be thereby decreased. As these factors including the width Ww of the conductive wire 40, the pitch Pw of the winds of the conductive wire 40 and the thickness Tw of the conductive wire 40 in combination are relevant to electrical characteristics including the inter-line capacity, they can be determined according to the required characteristics of the antenna. Thus a relation of $Cws \propto Ww \times Tw/(Pw-Ww)$ holds. Where the sectional area of the conductive wire is represented by Aw, if $Aw=Ww \times Tw(=\text{constant})$, $Ww=Aw/Tw$ will hold. Substituting this into the foregoing equation gives $Cws \propto Aw/(Pw-Aw/Tw)$. Therefore, the greater the Tw, the smaller the Cws and the greater the bandwidth theoretically, but as it is difficult in actual antenna manufacturing to wind a wire in a relation of Ww<Tw, it is more reasonable to determine in advance the Tw for the winding, and figure out the right Tw and Pw from the required bandwidth.

Next will be described one example of method of forming the conductive wire 40 with reference to FIGS. 1A, 1B, and 1C. A base 10 over which the power feed terminal 21 and the fixing terminal 22 are pattern-printed in advance is prepared. With its end faces 15 and 16 being held between jigs (not shown), the base 10 is set onto a winding machine (not shown). Similarly, a long conductive wire 40 of 0.8 mm in width Ww and 0.13 mm in thickness Tw, wound around a reel, is set onto a winding machine. The power feed terminal 21 and the conductive wire 40 are fixed to the connecting portions 41 by soldering. By shifting the conductive wire machine in the lengthwise direction of the base 10 while rotating the base 10, the conductive wire 40 is wound around the base 10 by 3.5 turns.

For use in the present invention, though the conductive wire 40 may be either round or rectangular in sectional shape, the use of a flat and rectangular wire helps stabilize conductive wiring on the base 10 as stated above. Where a round or simply rectangular conductive wire 40 may deviate in the lengthwise direction of the base 10 during the conductive wiring work, and a groove in which to fit the conductive wire may have to be cut in the base 10, a flat and rectangular wire can be wound round the base 10 immovably by virtue of its own rigidity. As the configuration so far described makes unnecessary any bobbin for the conductive wire or any groove cut into the base 10 in which to fit the conductive wire, the freedom of design regarding the dimensions of the conductive wire 40, namely the width Ww and thickness Tw of the conductive wire 40, the pitch Pw of the winds of the conductive wire 40, and the number of turns of the conductive wire 40 is enhanced, and the use of general purpose winding machines and jigs is facilitated. If the sectional area of the wire is the same, winding a flat and rectangular round the base can serve to reduce the thickness of the wound layer, resulting in a thinner and smaller antenna, which in turn contributes to making the radio apparatus more compact.

[Configuration of Antenna Base]

The shape of the base 10 can be selected as appropriate for a given purpose, but a prismatic shape can contribute to greater mounting stability and prevention of accidental turning of the chip antenna 80 among other advantages. Therefore, this shape facilitates ensuring of mounting stability and the positioning over the substrate 50.

The material of the base 10 may be a dielectric, magnetic substance or mixture thereof.

Where a dielectric is to be used for the base 10, its wavelength shortening effect contributes to reducing the antenna size. Alumina can be used, for example. Specific examples of alumina composition fit for the purpose include $Al_2O_3$ of 92 wt. % or more, $SiO_2$ of 6 wt. % or less, MgO wt. % of 1.5 wt. % or less, $Fe_2O_3$ of 0.1 wt. % or less and $Na_2O$ of 0.3 wt. % or less. Other usable materials include forsterite, magnesium titanate compounds, calcium titanate compounds, zirconia-tin-titanium compounds, barium titanate compounds, lead-calcium-titanium compounds, silicon nitride, silicon carbide and other ceramics.

Where a magnetic substance is to be used for the base 10, as it can have a high inductance Lw, the impedance of the material can be increased to reduce the Q-value of the antenna and thereby to expand its bandwidth.

Where a mixture of dielectric and magnetic substance is to be used for the base 10, its wavelength shorting effect can be utilized to reduce the chip antenna size, and its effect to lower the Q-value of the antenna can serve to expand its bandwidth. This is because the wavelength shorting effect works both in terms of the dielectric constant $\in$ and the permeability $\mu$ as $L \propto 1/\sqrt{(\in\mu)}$, where L is the chip antenna length. This is because the Q-value of the antenna is enhanced as $\mu/\in$ governs the impedance. The magnetic material should preferably be highly permeable, but the losses increase as the frequency rises. For this reason, a high-frequency but low-loss magnetic material is preferable for use in antennas for cellular phones, and the actually used ones include Mn—Zn ferrites, Ni—Zn ferrites and ferrites of the hexagonal system. Magnetic materials for use in low-frequency antennas for radios and the like include permalloy, Fe-based amorphous materials, Co-based amorphous materials, Fe-based hyperfine crystal materials and other metallic soft magnetic materials.

[Antenna Device 1]

Figure 5B:
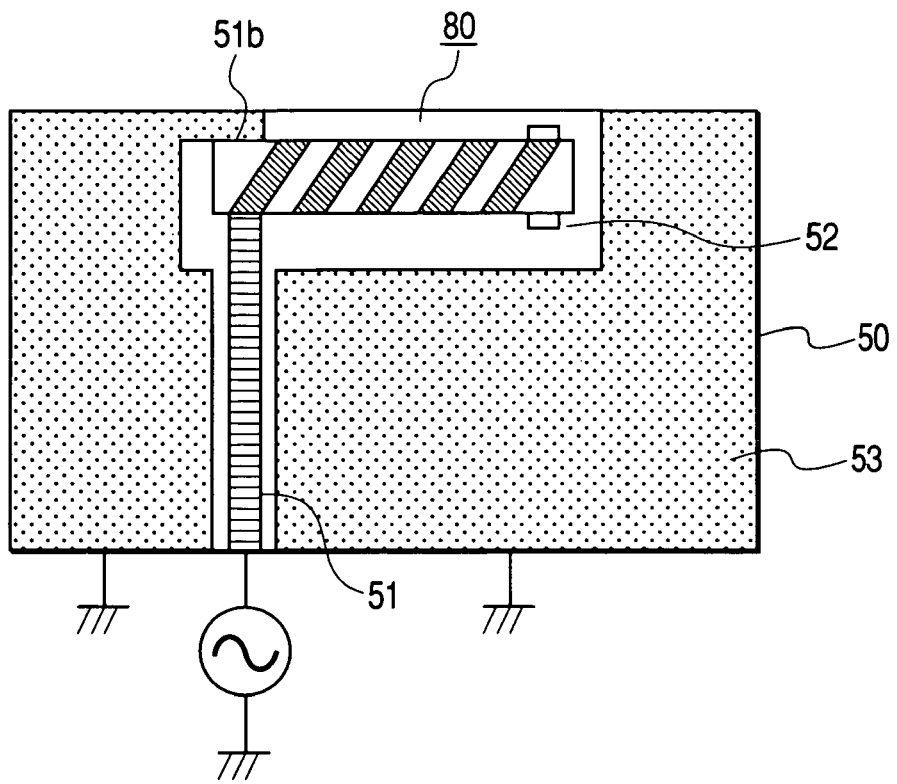
Figure 5C:
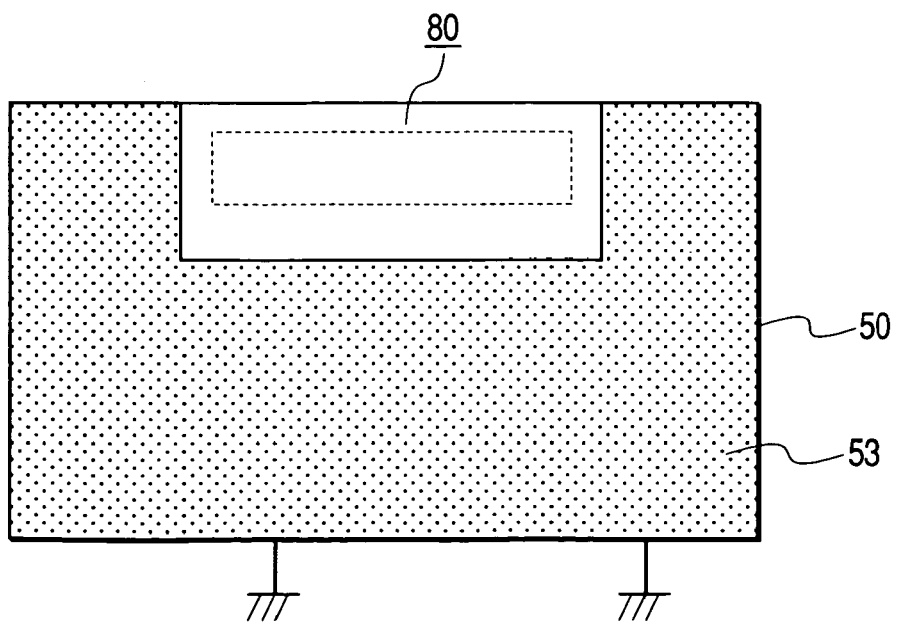

FIGS. 5A, 5B, and 5C illustrate an example of antenna device configured by mounting the chip antenna 80 described above over the circuit substrate 50. One end of the conductive wire 40 is connected to a high-frequency power source via a power feed electrode pattern 51. A fixing pattern 52 is intended to fix the chip antenna 80 by soldering to the substrate 50 via the fixing terminal 22. Between the fixing pattern 52 and a ground pattern 53 is formed an electrostatic capacity with a gap in-between. Since in the chip antenna 80 embodying the invention in this manner, the open end of the conductive wire 40 is isolated from the open portion 42 by the fixing terminal 22 and accordingly by the fixing pattern 52 as described with reference to FIG. 1B, the electrostatic capacity CWg between the conductive wire 40 and the ground is further reduced, and the bandwidth of the antenna is correspondingly expanded.

FIG. 5B shows a plan of the substrate 50 viewed from the side where the chip antenna 80 is mounted, and FIG. 5C, a plan of the substrate 50 viewed from the rear face side. Referring to FIG. 5C, there is no ground pattern 53 in the portion matching the face on which the chip antenna 80 is mounted, so that no electrostatic capacity can be formed between the chip antenna 80 and the substrate 50. This enables the bandwidth to be expanded. To add, referring to FIG. 5B again, the other side of the power feed pattern 51 of the power feed terminal 21 is connected to the ground pattern 53 and thereby grounded.

[Antenna Device 2]

Figure 6:
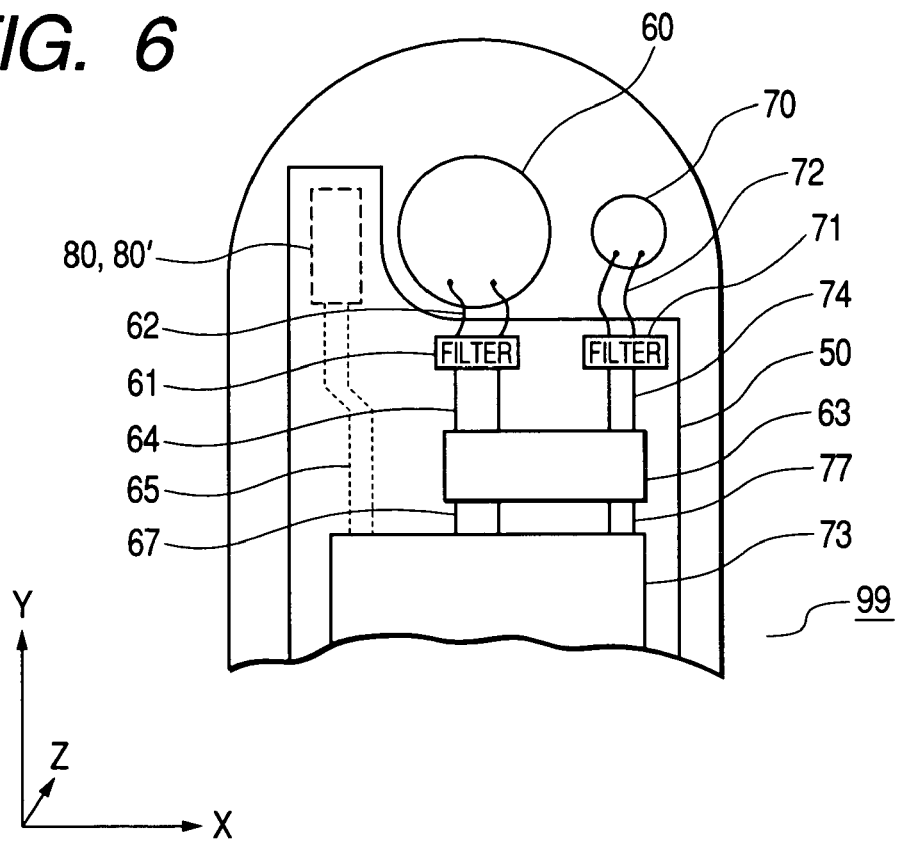
FIG. 6 pertains to an antenna device according to the invention, roughly illustrating an embodiment in which a chip antenna and metallic functional components are arranged close to each other.

FIG. 6 is a partial schematic diagram of communication equipment 99, such as a cellular phone, using an antenna device mounted with a surface mount type chip antenna. A second object of the present invention is to prevent interference between any metallic functional component, such as a loudspeaker, and a chip antenna arranged close to it. In this antenna device, where the chip antennas 80 and 80' are arranged at distances not longer than a ¼ wavelength of the electromagnetic waves radiating from metallic functional component including a loudspeaker 60 and a vibrator 70, and the antenna adjoining them, filter circuits 61 and 71 are connected to terminals on the power supply unit 63 side of the metallic functional components. Incidentally, the chip antenna for use here may be of course the chip antenna 80 described above, but is not limited to this. Any known conventional chip antenna 80' can as well be used. Thus the essential point of this aspect of the invention is, in an antenna device in which metallic functional components and a chip antenna adjoin each other, to connect filter circuits to the power source side terminals of metallic functional components, but the type of the chip antenna does not matter. Further, though FIG. 6 illustrates an example in which the chip antenna 80 or 80' and the filter circuits 61 and 71 are separately provided, they can as well be integrated into a module. A module in which chip antennas and filters are integrated or one in which filters and metallic functional components can as well be architected.

Figure 7:
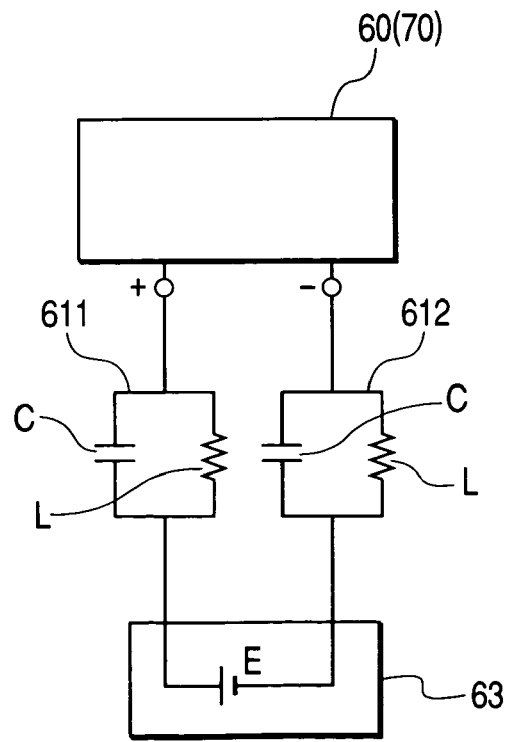
FIG. 7 shows an equivalent circuit to a filter circuit connected to terminals on the power source side of a metallic functional component.

Now in a communication/control unit 73 taking charge of communication by and control over the cellular phone 99 in the illustration of FIG. 6, the power supply unit 63 is connected bylines 67 and 77 and supplies drive currents to the loudspeaker 60 and the vibrator 70 via the filters 61 and 71. On the other hand, the chip antenna 80 or 80' is connected via a line 65. Over the circuit substrate is arranged the IC of the communication/control unit 73 and the power supply unit 63, and lines 64, 65, 67, 74 and 77 are print-wired. The circuit substrate 50 has notches, in which the loudspeaker 60 and the vibrator 70 are separately arranged. The connection between the loudspeaker 60 and the vibrator 70 on one hand and the filters 61 and 71 on the other is accomplished with leads 62 and 72. This separate arrangement contributes to reducing the height. As a further contrivance to reduce the thickness (the dimension in the Z direction) of the cellular phone 99 is the arrangement of the chip antenna 80 or 80' on the rear face of the printed circuit board 50. The filters 61 and 71 are composed of LC filters 611 and 612 as shown in FIG. 7, and they are notch filters which cut off a specific frequency band each. According to the invention, as described above and illustrated in FIG. 7, filter circuits consisting of notch filters or the like are connected to the power source side terminals of such metallic functional components and the loudspeaker 60 and/or the vibrator 70.

Embodiment 1

The chip antenna 80 according to the present invention will be described below in more specific terms with reference to preferred embodiments of the invention. A copper wire of 0.8 mm in width Ww is wound 3.5 turns around the base 10 of a dielectric measuring 3 mm in width, 15 mm in length and 2 mm in width to constitute a conductive wire 40 layer of 0.13 mm in thickness Tw. The depth dg of the concave 30 is 0.5 mm. As the power feed terminal 21 and the fixing terminal 22 are used Ag electrodes pattern-printed in advance.

To add, the metallic functional components in the embodiment can be arranged close to the surface mount type chip antenna, i.e. within the range of ¼ of the wavelength of the electromagnetic waves received by the antenna.

To cite an example regarding λ/4 with respect to a cellular phone in a specific communication system, the following can be said.

First, where the frequency of the carrier used in the communication system is represented by fo [MHz]:

λ/4=300×1000/fo/4 [mm] holds, and hence:

for a cellular phone (in a frequency band of 800 MHz, λ/4=93.75 [mm] or less, for a wireless LAN or Bluetooth (in a frequency band of 2400 MHz), $\lambda/4=31.25$ [mm] or less, and for a wireless LAN (in a frequency band of 5 GHz), $\lambda/4=15$ [mm] or less.

To add, in the case of a cellular phone, experience shows that the antenna is significantly affected by metallic components mounted within a 30-mm radius of it. For this reason, the invention is particularly suitable for use in a cellular phone in which metallic components are mounted within a $\lambda/10$ radius.

Figure 9:
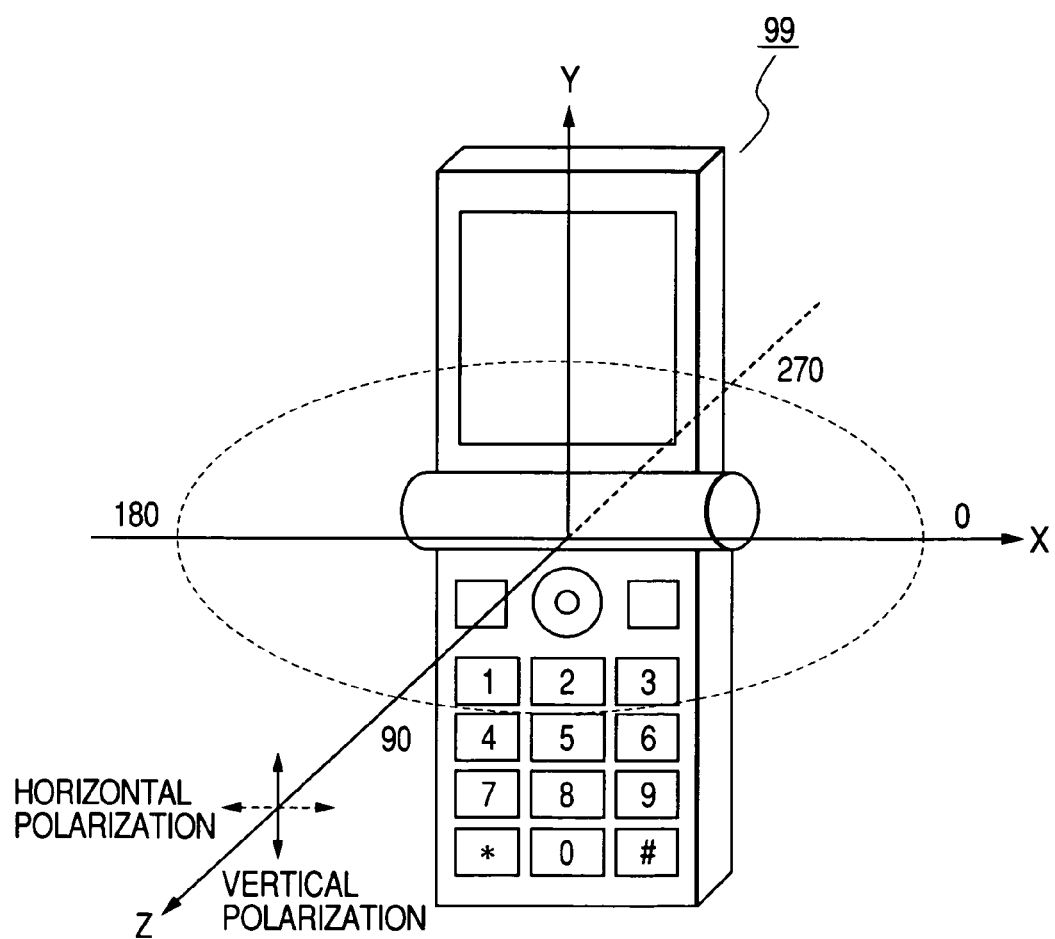
FIG. 9 is a schematic diagram showing the ranges in which the power gain and the directionality pattern of the surface mount type chip antenna pertaining to the invention are measured.

FIGS. 8A, 8B, and 8C show an example of communication equipment 99 provided with the chip antenna 80 mounted over the substrate 50. This communication equipment 99 was tested in an anechoic chamber with an antenna gain measuring device using a network analyzer to measure the power gain and the directionality pattern of the antenna. The measurement was done on the ZX plane shown in FIG. 9, and the oscillating directions of the vertical polarization and the horizontal polarization are the directional components shown in FIG. 9.

Figure 10:
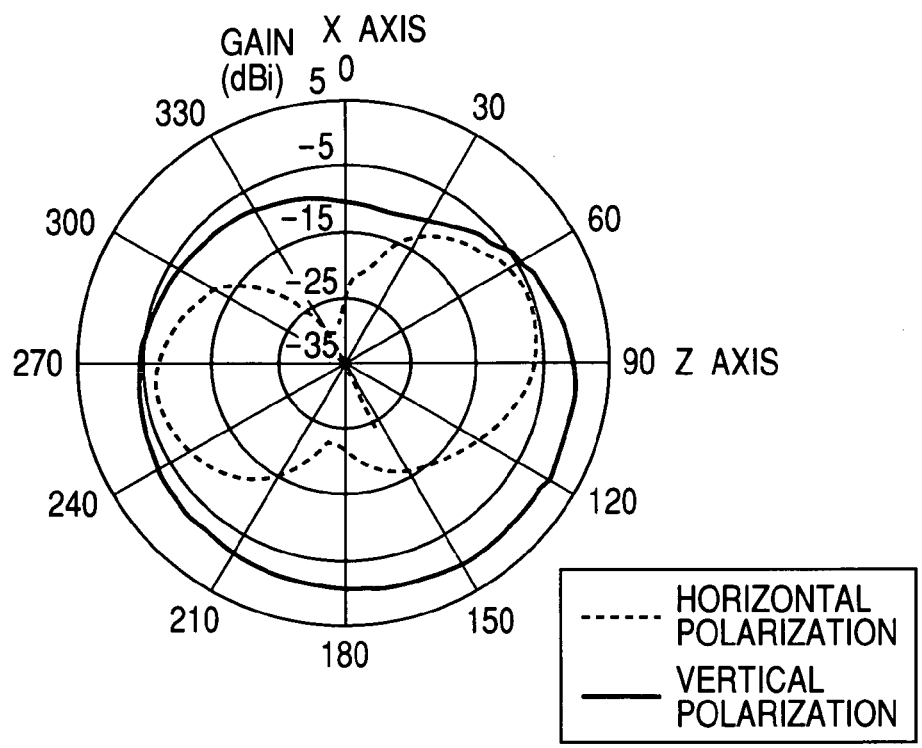
FIG. 10 shows the power gains and the directionality patterns of the surface mount type chip antenna pertaining to the invention.

FIG. 10 shows the power gains and the directionality patterns of the vertical polarization (solid line) and the horizontal polarization (broken line) The antenna of this embodiment was thus confirmed to have satisfactory antenna characteristics.

Figure 11:
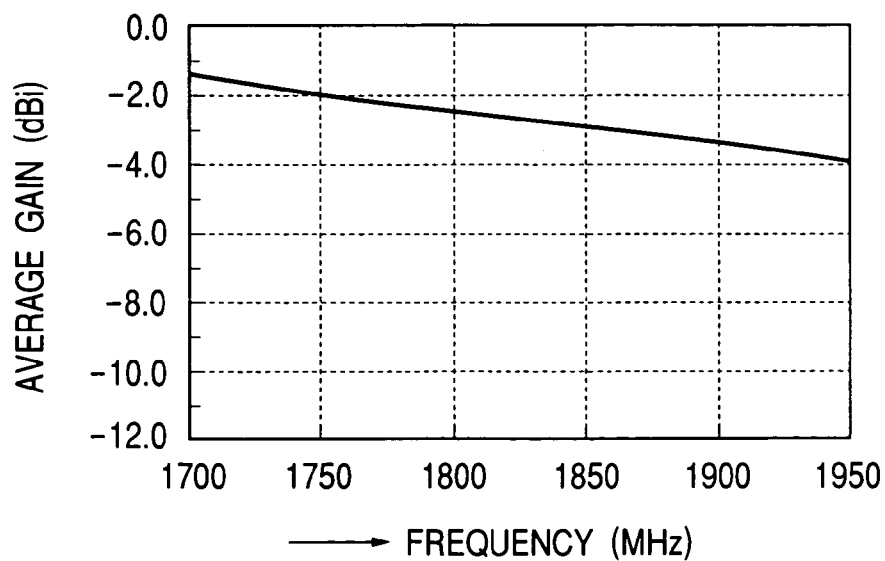
FIG. 11 shows the frequency characteristic of the average gain of the surface mount type chip antenna pertaining to the invention.

The frequency characteristic of the average gain is shown in FIG. 11. The average gain represents the average of the gains of the vertical polarization shown in FIG. 10. It is seen that satisfactory antenna gains of −4 dBi or more are achieved over a broad frequency range. Thus, a broad bandwidth is attained. Here, dBi is the unit of measuring the output emitted by an antenna relative to a reference antenna, and expressed in decibels.

Next, a similar test was carried out with a conventional chip antenna shown in FIG. 21. The average in this case was as low as −7 dBi. Also, the bandwidth was found to be about ½ of that of the antenna according to the invention.

Embodiment 2

Figure 12A:
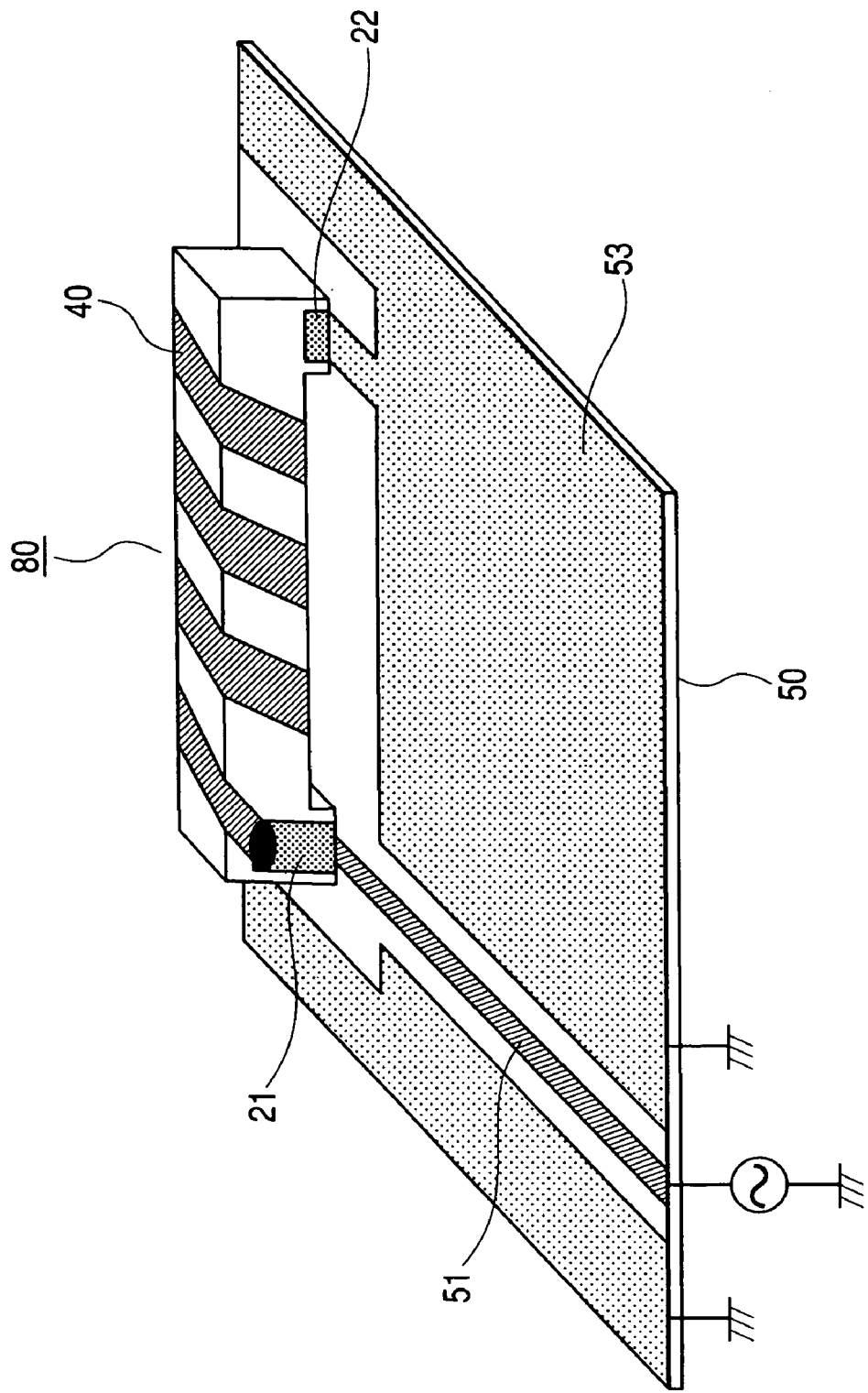
FIGS. 12A, 12B, and 12C illustrate a surface mount type chip antenna, which is another preferred embodiment of the invention, mounted on a substrate.
Figure 12B:
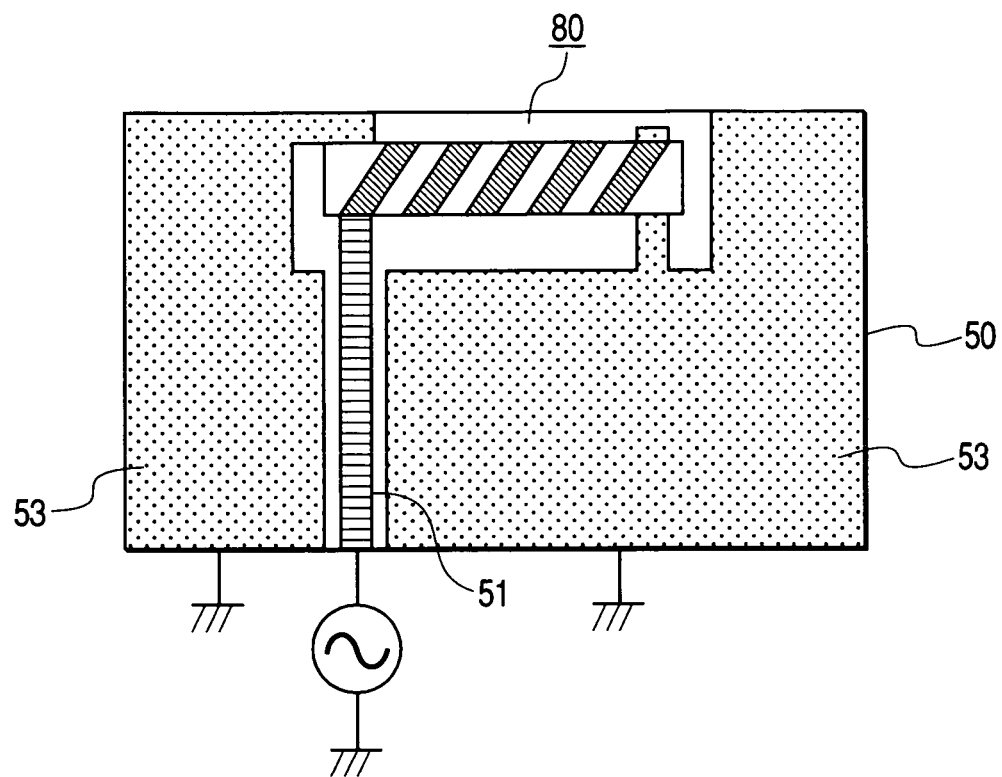
Figure 12C:
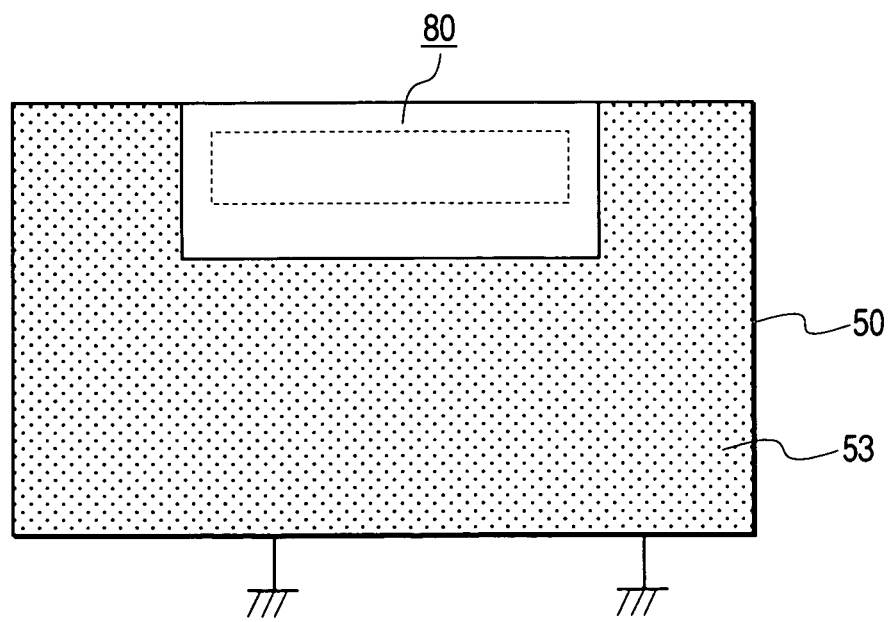

FIGS. 12A, 12B, and 12C illustrate another preferred embodiment of the invention. FIG. 12A shows an example in which the fixing terminal 22 is connected to the ground pattern 53 in Embodiment 1. FIG. 12B shows a plan of the mounted face, and FIG. 12C, a plan viewed from the reverse side to the mounted side. In this case, the distance between the open end 42 and the ground pattern 53 is shortened, and the electrostatic capacity that is formed is enlarged. Further in this embodiment, the power feed terminal of the chip antenna and a grounding conductor on the substrate side are connected. With this structure, the antenna input side impedance was adjusted to 50 Ω. In this way, the bandwidth and the antenna gain can be regulated. In this case too, as in Embodiment 1, the bandwidth is 120 MHz at a frequency of 850 MHz, sufficient as the bandwidth for cellular phones. The antenna gain is 0 dB, no inferior to that of any conventional whip antenna.

Embodiment 3

Figure 13A:
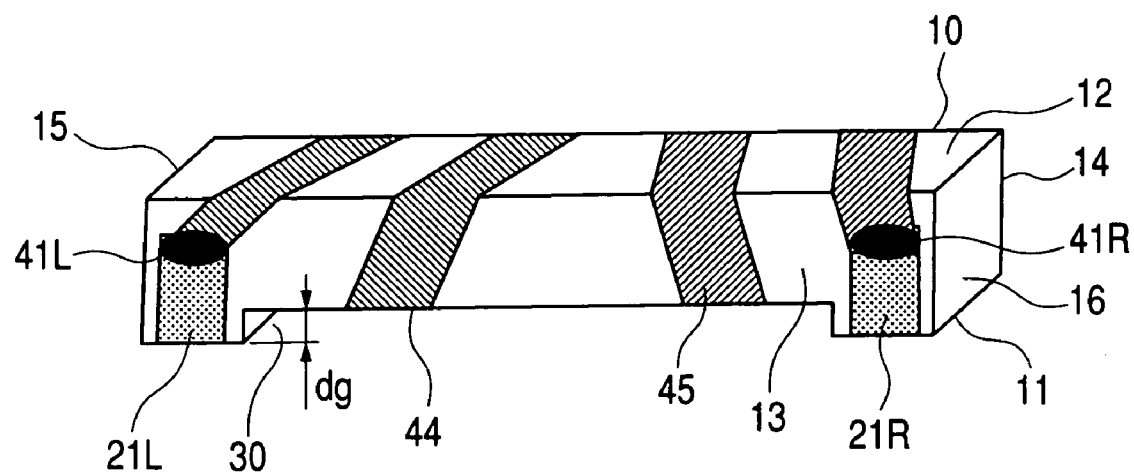
Figure 13B:
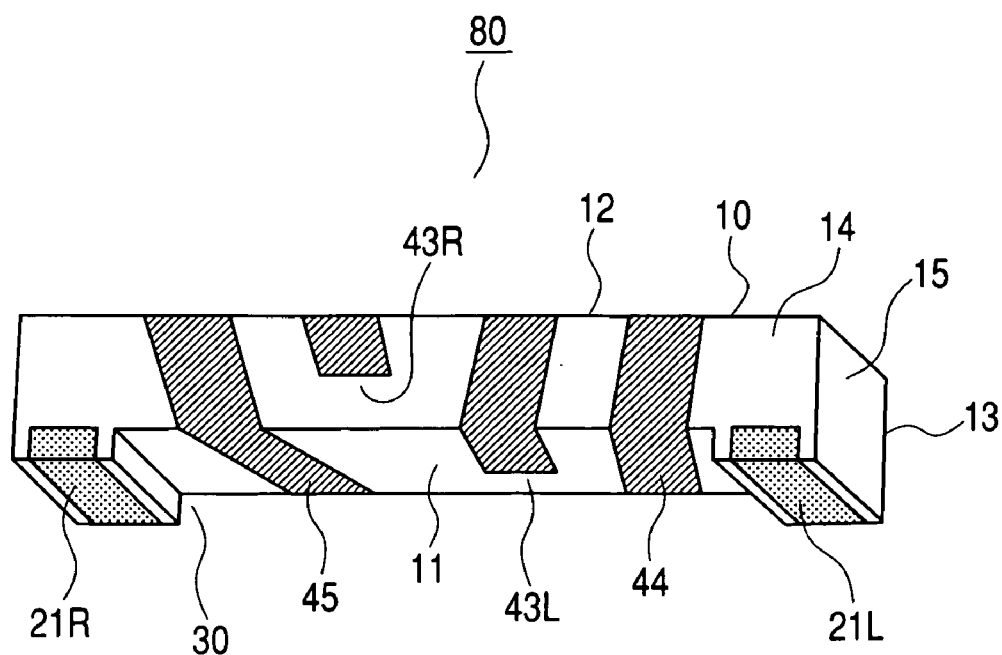

FIGS. 13A, 13B, and 13C illustrate an example in which two conductors 44 and 45 are wound to match dual bands. FIG. 13B shows a view reverse to FIG. 13A. The first conductor 44 is wound clockwise around the base 10 from a power feed terminal 21L to form an open end 43L, while the second conductor 45 is wound counterclockwise around the base 10 from a power feed terminal 21R to form an open end 43R. FIG. 13C shows the antenna mounted on the substrate 50. The power feed terminals 21R and 21L at the two ends of the surface mount type chip antenna 80 are connected to a high-frequency power source via power feed patterns 51R and 51L. In this case too, as in Embodiment 1, satisfactory bandwidths and antenna gains were obtained. By varying the numbers of turns of the two windings, they can be differentiated in resonance frequency, and dual band operations are generated. Although the foregoing description of Embodiment 3 supposes that the directions of the two windings are reverse to each other, dual band antenna operations can also be achieved even if the two are wound in the same direction.

Embodiment 4

Figure 14A:
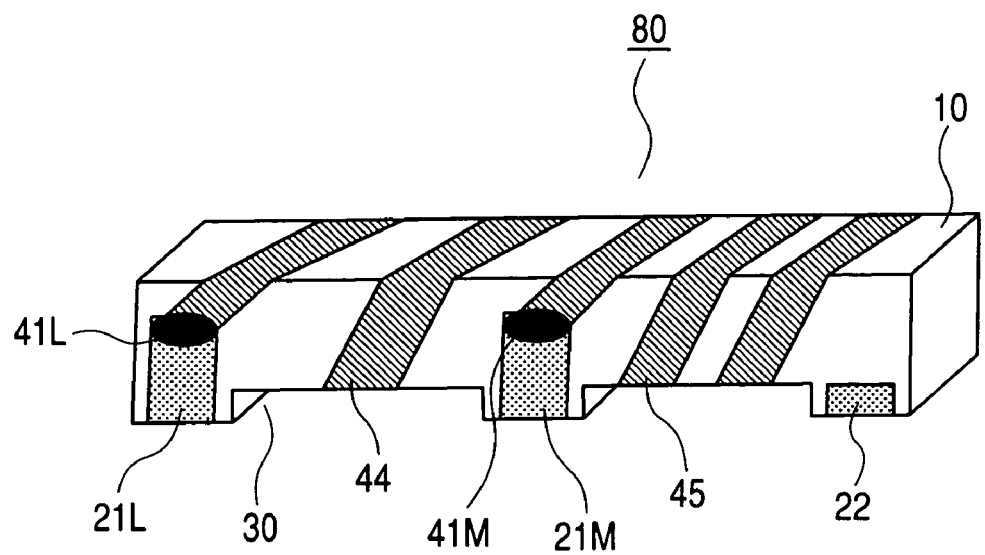
FIGS. 14A and 14B illustrate a surface mount type chip antenna, which is yet another preferred embodiment of the invention.
Figure 14B:
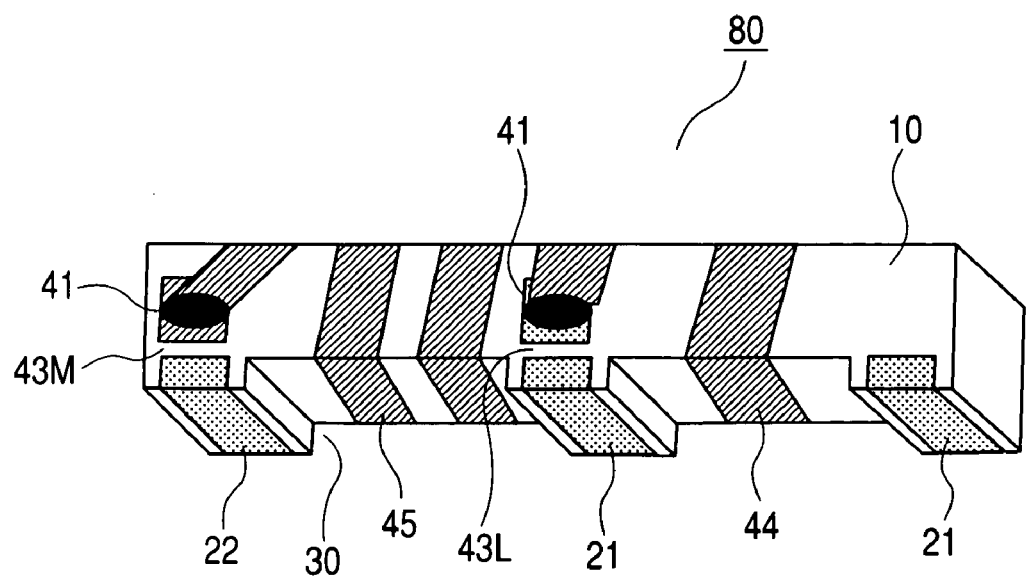

FIGS. 14A and 14B show still another preferred embodiment of the invention. The first conductor 44 is wound clockwise around the base 10 from the power feed terminal 21L to form the open end 43L, and the second conductor 45 is also wound clockwise around the base 10 from a power feed terminal 21M, provided in the central part of the base 10, to form an open end 43M. FIG. 14B shows a view reverse to FIG. 14A. In this case too, as in Embodiment 1, satisfactory bandwidths and antenna gains were obtained. To be more specific, at a frequency of 850 MHz, the bandwidth is 110 MHz and the antenna gain, 0 dB, no inferior to that of any conventional chip antenna or whip antenna.

Figure 15A:
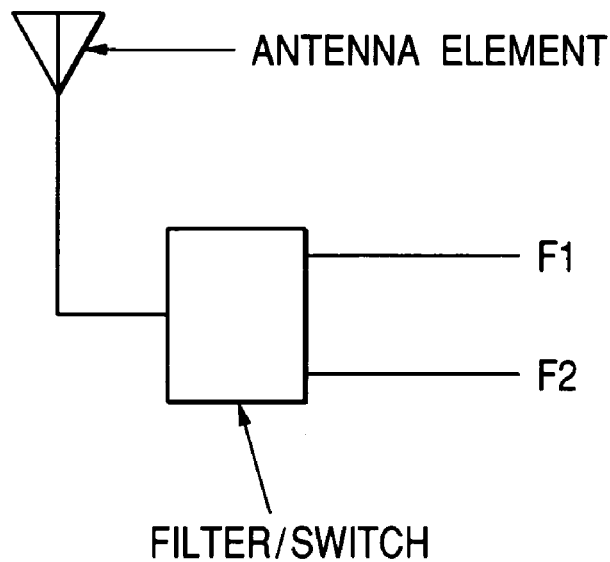
FIGS. 15A and 15B are schematic diagrams illustrating the switching of a surface mount type chip antenna pertaining to the invention.
Figure 15B:
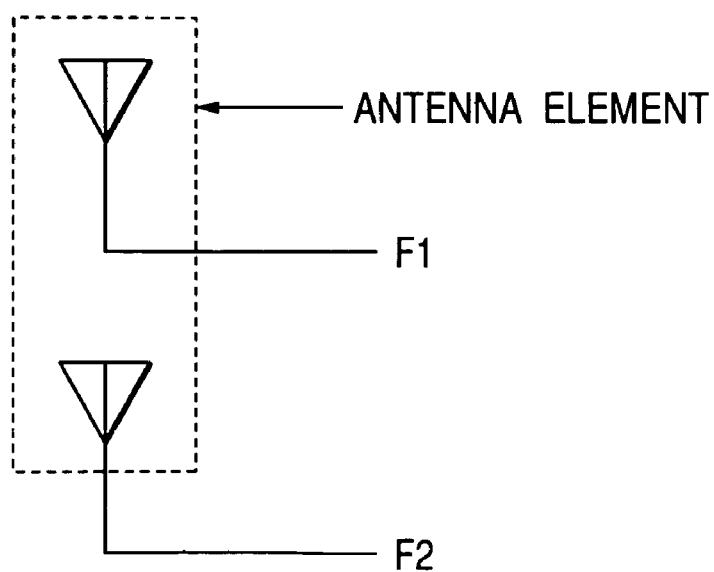

FIGS. 15A and 15B are schematic diagrams illustrating the switching of the surface mount type chip antenna pertaining to the invention: FIG. 15A shows a case in which the antenna has one antenna element as in Embodiments 1 and 2; and FIG. 15B, a case in which it has two antenna elements. In the latter case, as described with reference to Embodiments 3 and 4, signals can be independently transmitted from and received by the first conductor 44 and the second conductor 45 wound round the single base 10, and the input/output terminals for that purpose can be formed from the single base. Accordingly, there is no need for an antenna duplexer, band-pass filter or switch. Since the surface mount type chip antenna pertaining to the invention has a broad bandwidth as shown in FIG. 11, even signals of F1 and F2 wide apart infrequency can be handled by a single surface mount type chip antenna.

Embodiment 5

FIGS. 16A, 16B, 16C, 17A, 17B, and 17C show other examples of communication equipment 99 mounted with the surface mount type chip antenna 80 according to the invention. The surface mount type chip antenna 80 can be arranged not only in the mounting position shown in FIG. 8 but also in various other positions. This is because the surface mount type chip antenna 80 according to the invention manifests a favorable directional pattern as shown in FIG. 10. In both cases, the chip antenna and the transmitter/receiver circuit are connected by a transmission line. This line can be configured of a coaxial cable, a flexible cable, a microstrip line formed over the substrate, or the like. Further, where the antenna is arranged near the microphone on the keyboard side of the cellular phone as shown in FIGS. 16A, 16B, and 16C, the antenna is away from the user's head when the cellular phone is used, and the resultant decrease in the partial absorption of the electromagnetic wave transmitted from the antenna provides the benefit of reducing the disturbance of directionality and ensuring stable communication.

Embodiment 6

Figure 18:
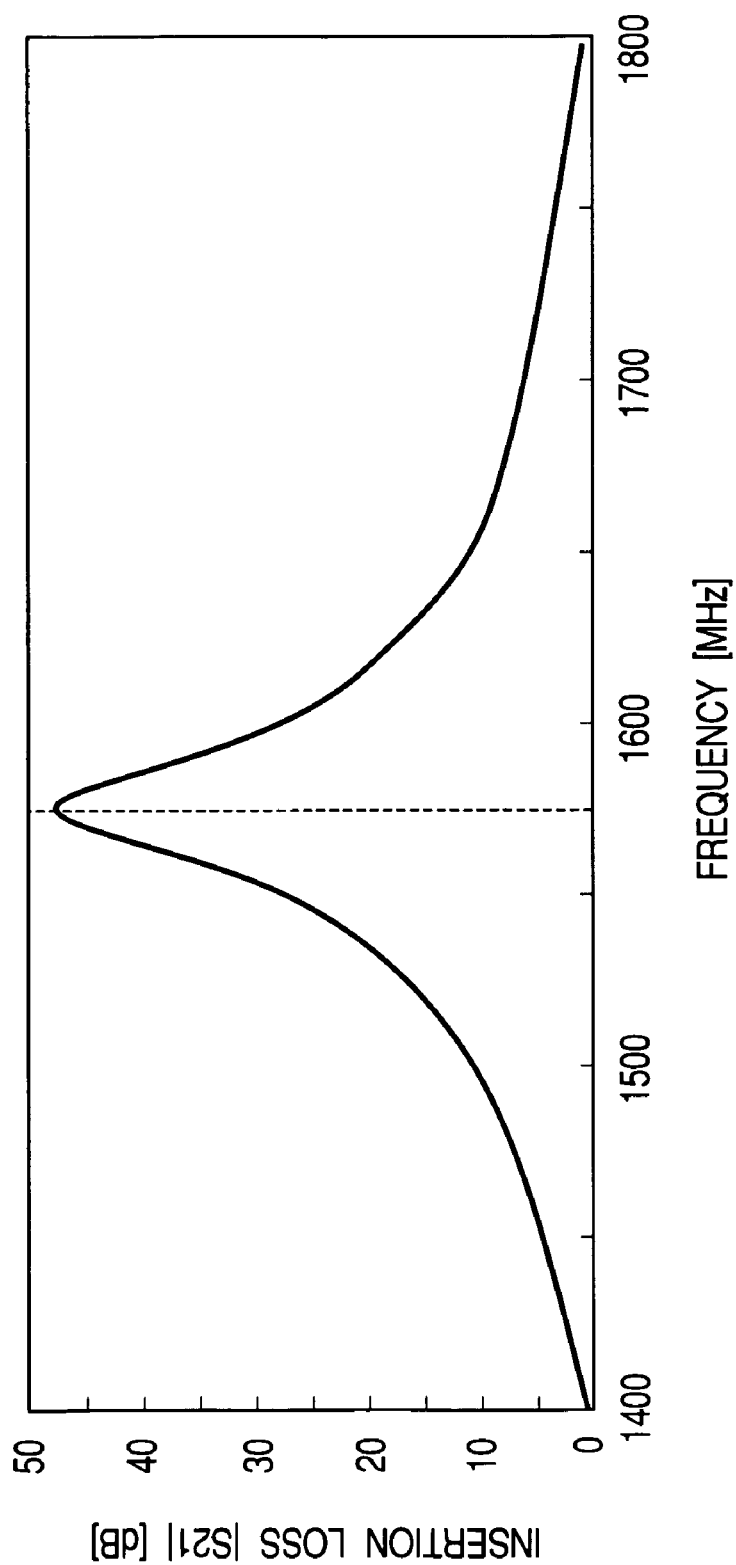
FIG. 18 shows the result of measurement of the frequency characteristic of an equivalent circuit shown in FIG. 7.

Another aspect of the invention relates to an antenna device in which the chip antenna and metallic functional components such as a loudspeaker, vibrator, small CCD camera and the like are arranged close to each other, and filter circuits are connected to the power source side terminal of these metallic functional components (see FIG. 6 and FIG. 7). FIG. 18 shows the result of measurement of the frequency characteristic of an equivalent circuit shown in FIG. 7 with a network analyzer, wherein capacitors C and the inductors L of notch filters 61 and 71 centering on 1,575 GHz are 0.5 pF and 18 nH, respectively. The insertion losses of the notch filters (=the absolute values of S21 parameter measurements [dB]) reached their maximum of 47 dB in the vicinity of a frequency of 1575 MHz. The greater the insertion loss, the easier the cut-off of input signals, and this cut-off frequency fc [Hz] is determined from the following equation from the combination of the circuit elements of the notch filters (L and C): $fc=2\pi/\sqrt{(L \times C)}$.

By using filters having such a frequency characteristic centering on 1575 MHz, the resonant current of the resonance frequency 1575 MHz of the antenna can be prevented from flowing to the metallic functional components. In the absence of the notch filters 61 and 71 shown in FIG. 6, the inductive coupling of the resonant current flowing in the chip antenna would be oriented in the direction in which the metallic portions around the antenna prevent the antenna current from flowing to the grounding conductor. The resultant obstruction of the radiation of the electromagnetic wave from the antenna to the space would invite a drop in radiation efficiency and gain. By providing, between the metallic components and the grounding conductor on the substrate, notch filters of the same frequency band as the electromagnetic wave as shown in FIG. 6, the currents flowing through the metallic components can be obstructed, enabling the electromagnetic wave to be efficiently radiated from the antenna. Incidentally, the distance at which currents are more likely to be induced in the metallic components by the resonant currents of the antenna is at or below a ¼ wavelength of the electromagnetic wave and, in this embodiment as well, using this distance contributes to enhancing the efficiency and gain of the antenna.

Figure 19:
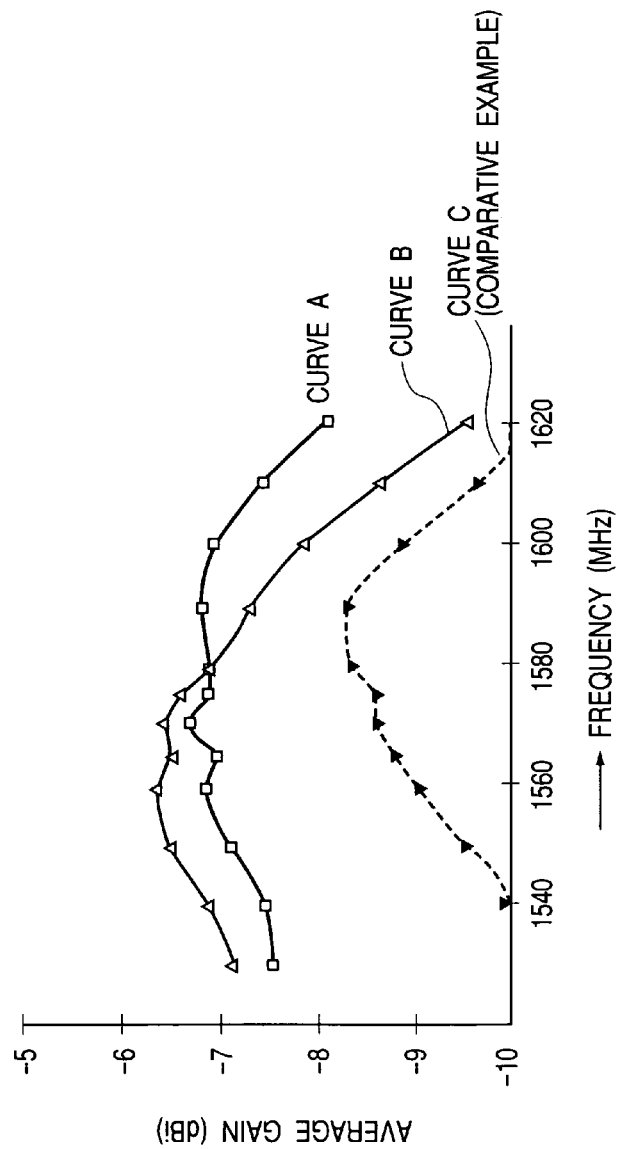
FIG. 19 shows the frequency characteristic of the average gain of the antenna device shown in FIGS. 6 and 7 with a comparative case.
Figure 20:
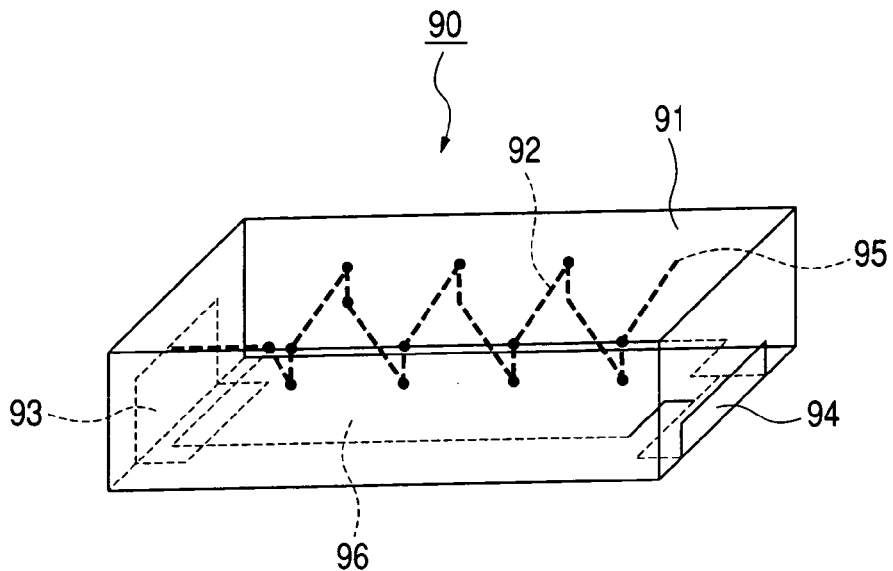
FIG. 20 shows a perspective view of one example of conventional surface mount type chip antenna.

Next, FIG. 19 shows the frequency characteristic of the average gain. The testing conditions here are the same as those for FIG. 18, and the measuring instrument used was a network analyzer. In measuring the gain, power radiating from the tested antenna, used as the transmission antenna in the anechoic chamber, was received with a reference antenna for reference use, and evaluation was made in terms of the ratio between this received power and the power received by a reference antenna used as the transmission antenna. The unit dBic is the decibel count indicating the gain of an imaginary antenna radiating power uniformly in every direction in circular polarization. The solid line represents the present invention and the broken line, a comparative example. Curve A refers to a case in which only the loudspeaker 60 is mounted as a metallic functional component and the filter 61 is provided; curve B, a case in which the loudspeaker 60 and the vibrator 70 are mounted and the filters 61 and 71 are provided; and curve C, the comparative case in which neither filter 61 nor 71 is used.

From FIG. 19, an improvement in average gain by 1 dB or more is seen in curve B, which represents the use of the filters, over curve C representing the comparative example. This effect is attributable to the presence of the filters 61 and 71.

According to the present invention, a chip antenna which allows manufacturing in a simple process, ready adjustment, excels in mounting stability and has a broad bandwidth and enhances radiation efficiency can be realized.

What is claimed is:

1. A surface mount type chip antenna comprising a base made of a dielectric, magnetic substance or mixture thereof, at least one terminal portion provided on the mounted face of said base, a concave provided in the mounted face of said base except in said terminal portion, and at least one flat and rectangular conductive wire wound around said base,
    wherein the base of said chip antenna is 5 mm or less in thickness and 30 mm or less in length, the depth of the concave is not more than ½ of the thickness of said base, and
    said flat and rectangular conductive wire is 0.5 to 2 mm in width and 0.05 and 0.2 mm in thickness.

2. Communication equipment mounted with the surface mount type chip antenna according to claim 1.

3. A surface mount type chip antenna comprising a base made of a dielectric, magnetic substance or mixture thereof, at least one terminal portion provided on the mounted face of said base, a concave provided in the mounted face of said base except in said terminal portion, and at least one conductive wire wound around said base,
    wherein a plurality of said conductive wires and at least two of said terminal portions are provided to be responsive to a plurality of frequency bands.

4. A surface mount type chip antenna comprising a base made of a dielectric, magnetic substance or mixture thereof, at least one terminal portion provided on the mounted face of said base, a concave provided in the mounted face of said base except in said terminal portion, and at least one flat and rectangular conductive wire wound around said base,
    wherein a plurality of said conductive wires and at least two of said terminal portions are provided to be responsive to a plurality of frequency bands.

5. The surface mount type chip antenna, according to claim 1 or 4, wherein said flat and rectangular conductive wire is spirally wound in said concave.

6. A surface mount type antenna device comprising a surface mount type chip antenna arranged in the vicinity of metallic functional components, and high frequency removal filter circuits connected to the power source side terminal of said metallic functional components, said high frequency removal filter circuits being capable of obstructing the resonant current of the resonance frequency of said chip antenna.

7. The surface mount type antenna device, according to claim 6, wherein said metallic functional components include at least one of a loudspeaker, a vibrator and a small COD camera.

8. The surface mount type antenna device, according to claim 6 or 7, wherein the shortest distance between said surface mount type chip antenna and metallic functional components is not more than ¼ of the wavelength of the electromagnetic wave radiated from that chip antenna or received by the antenna.

9. The surface mount type antenna device, according to claim 6, wherein said chip antenna comprises a base made of a dielectric, magnetic substance or mixture thereof, at least one terminal portion provided on the mounted face of said base, a concave provided in the mounted face of said base except in said terminal portion, and at least one conductive wire wound around said base.

10. The surface mount type antenna device, according to claim 9, wherein said conductive wire is a flat and rectangular conductive wire and constitutes a chip antenna spirally wound in said concave.

11. The surface mount type antenna device, according to claim 10, wherein the base of said chip antenna is 5 mm or less in thickness and 30 mm or less in length, the depth of the concave is not more than ½ of the thickness of said base, and said flat and rectangular conductive wire is 2 mm or less in width and 0.01 to 0.2 mm in thickness.

12. Communication equipment mounted with the surface mount type chip antenna according to claim 6.

13. A surface mount type antenna device comprising a base made of a dielectric, magnetic substance or mixture thereof, at least one terminal portion provided on the mounted face of said base, a concave provided in the mounted face of said base except in said terminal portion, and at least one conductive wire wound around said base,
 wherein a plurality of said conductive wires and at least two of said terminal portions are provided to be responsive to a plurality of frequency bands,
 a surface mount type chip antenna arranged in the vicinity of metallic functional components, and
 high frequency removal filter circuits connected to the power source side terminal of said metallic functional components said high frequency removal filter circuits being capable of obstructing the resonant current of the resonance frequency of said chip antenna.

* * * * *